(12) United States Patent
Dasgupta et al.

(10) Patent No.: US 10,930,500 B2
(45) Date of Patent: Feb. 23, 2021

(54) WURTZITE HETEROEPITAXIAL STRUCTURES WITH INCLINED SIDEWALL FACETS FOR DEFECT PROPAGATION CONTROL IN SILICON CMOS-COMPATIBLE SEMICONDUCTOR DEVICES

(71) Applicant: Intel Corporation, Santa Clara, CA (US)

(72) Inventors: Sansaptak Dasgupta, Hillsboro, OR (US); Han Wui Then, Portland, OR (US); Benjamin Chu-Kung, Portland, OR (US); Marko Radosavljevic, Beaverton, OR (US); Sanaz K. Gardner, Hillsboro, OR (US); Seung Hoon Sung, Portland, OR (US); Ravi Pillarisetty, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/431,646

(22) Filed: Jun. 4, 2019

(65) Prior Publication Data
US 2019/0287789 A1    Sep. 19, 2019

Related U.S. Application Data

(63) Continuation of application No. 15/504,634, filed as application No. PCT/US2014/056299 on Sep. 18, 2014, now Pat. No. 10,325,774.

(51) Int. Cl.
*H01L 21/02*     (2006.01)
*H01L 29/778*    (2006.01)
(Continued)

(52) U.S. Cl.
CPC ...... *H01L 21/0265* (2013.01); *H01L 21/0254* (2013.01); *H01L 21/0262* (2013.01);
(Continued)

(58) Field of Classification Search
CPC .......... H01L 21/0265; H01L 21/02609; H01L 21/8252; H01L 27/0605; H01L 29/16;
(Continued)

(56) References Cited

U.S. PATENT DOCUMENTS 4,961,194 A    10/1990   Kuroda et al.
5,367,183 A    11/1994   Perea et al.
(Continued)

FOREIGN PATENT DOCUMENTS

CN    1279733    1/2001
CN    1409868    4/2003
(Continued)

OTHER PUBLICATIONS

Ex Parte Quayle action mailed Nov. 5, 2018 for U.S. Appl. No. 15/504,635.
(Continued)

*Primary Examiner* — Mohammed R Alam
(74) *Attorney, Agent, or Firm* — Green, Howard & Mughal LLP

(57) ABSTRACT

III-N semiconductor heterostructures including a raised III-N semiconductor structures with inclined sidewall facets are described. In embodiments, lateral epitaxial overgrowth favoring semi-polar inclined sidewall facets is employed to bend crystal defects from vertical propagation to horizontal propagation. In embodiments, arbitrarily large merged III-N semiconductor structures having low defect density surfaces may be overgrown from trenches exposing a (100) surface of a silicon substrate. III-N devices, such as III-N transistors, may be further formed on the raised III-N semiconductor (Continued)

structures while silicon-based transistors may be formed in other regions of the silicon substrate.

18 Claims, 14 Drawing Sheets

(51) Int. Cl.
| | | |
|---|---|---|
| *H01L 29/04* | (2006.01) | |
| *H01L 29/06* | (2006.01) | |
| *H01L 29/20* | (2006.01) | |
| *H01L 21/8252* | (2006.01) | |
| *H01L 27/06* | (2006.01) | |
| *H01L 29/16* | (2006.01) | |
| *H01L 29/267* | (2006.01) | |
| *H01L 29/78* | (2006.01) | |
| *H01L 29/66* | (2006.01) | |

(52) U.S. Cl.
CPC .. *H01L 21/02381* (2013.01); *H01L 21/02433* (2013.01); *H01L 21/02521* (2013.01); *H01L 21/02609* (2013.01); *H01L 21/02639* (2013.01); *H01L 21/02647* (2013.01); *H01L 21/8252* (2013.01); *H01L 27/0605* (2013.01); *H01L 29/045* (2013.01); *H01L 29/0657* (2013.01); *H01L 29/16* (2013.01); *H01L 29/2003* (2013.01); *H01L 29/267* (2013.01); *H01L 29/7786* (2013.01); *H01L 29/7787* (2013.01); *H01L 29/7851* (2013.01); *H01L 29/0649* (2013.01); *H01L 29/66462* (2013.01); *H01L 29/7789* (2013.01); *H01L 29/785* (2013.01)

(58) Field of Classification Search
CPC ............... H01L 29/267; H01L 29/7787; H01L 29/7851; H01L 21/02381; H01L 21/02433; H01L 21/02521; H01L 21/0254; H01L 21/0262; H01L 21/02639; H01L 21/02647; H01L 29/7786; H01L 29/045; H01L 29/0657; H01L 29/2003; H01L 29/0649; H01L 29/785; H01L 29/66462; H01L 29/7789; H01L 27/088; H01L 21/8258; H01L 27/085
See application file for complete search history.

(56) References Cited

U.S. PATENT DOCUMENTS

| | | | |
|---|---|---|---|
| 6,121,153 A | 9/2000 | Kikkawa | |
| 6,225,196 B1 | 5/2001 | Yokoyama | |
| 6,261,929 B1 | 7/2001 | Gehrke et al. | |
| 6,325,850 B1 | 12/2001 | Beaumont et al. | |
| 6,521,514 B1 | 2/2003 | Gehrke et al. | |
| 6,608,327 B1 | 8/2003 | Davis et al. | |
| 6,617,668 B1 | 9/2003 | Koide et al. | |
| 7,501,669 B2 | 3/2009 | Parikh et al. | |
| 7,952,150 B1 | 5/2011 | Wohlmuth | |
| 8,173,551 B2 | 5/2012 | Bai et al. | |
| 8,313,967 B1 * | 11/2012 | Lee | H01L 29/045 |
| | | | 438/44 |
| 8,383,471 B1 | 2/2013 | Shinohara et al. | |
| 8,507,304 B2 | 8/2013 | Kryliouk et al. | |
| 8,519,438 B2 | 8/2013 | Mishra et al. | |
| 8,530,978 B1 | 9/2013 | Chu et al. | |
| 8,569,769 B2 | 10/2013 | Hwang et al. | |
| 8,629,477 B2 | 1/2014 | Lochtefeld et al. | |
| 8,772,786 B2 | 7/2014 | Tabatabaie et al. | |
| 8,836,016 B2 | 9/2014 | Wu et al. | |
| 9,000,485 B2 | 4/2015 | Lee et al. | |
| 9,117,777 B2 | 8/2015 | Vincent et al. | |
| 9,153,583 B2 | 10/2015 | Glass et al. | |
| 9,196,709 B2 | 11/2015 | Lee et al. | |
| 9,240,410 B2 | 1/2016 | Then et al. | |
| 10,056,456 B2 | 8/2018 | Then et al. | |
| 10,229,991 B2 | 3/2019 | Dasgupta et al. | |
| 10,325,774 B2 | 6/2019 | Dasgupta et al. | |
| 2001/0040246 A1 | 11/2001 | Ishii | |
| 2002/0110989 A1 | 8/2002 | Yamaguchi et al. | |
| 2002/0152952 A1 * | 10/2002 | Beaumont | H01L 21/02639 |
| | | | 117/95 |
| 2003/0045017 A1 | 3/2003 | Hiramatsu et al. | |
| 2004/0029365 A1 | 2/2004 | Linthicum et al. | |
| 2004/0169192 A1 | 9/2004 | Kato et al. | |
| 2006/0084245 A1 | 4/2006 | Khoda | |
| 2006/0124962 A1 | 6/2006 | Ueda et al. | |
| 2006/0181828 A1 | 8/2006 | Sato | |
| 2006/0197129 A1 | 9/2006 | Wohlmuth | |
| 2007/0045670 A1 | 3/2007 | Kuraguchi | |
| 2007/0278507 A1 | 12/2007 | Nakazawa et al. | |
| 2008/0036038 A1 | 2/2008 | Hersee et al. | |
| 2008/0070355 A1 | 3/2008 | Lochtefeld et al. | |
| 2008/0093622 A1 * | 4/2008 | Li | H01L 21/02381 |
| | | | 257/103 |
| 2008/0099785 A1 | 5/2008 | Bai | |
| 2008/0127884 A1 | 6/2008 | Tischler et al. | |
| 2008/0197358 A1 | 8/2008 | Frahm et al. | |
| 2009/0039361 A1 * | 2/2009 | Li | H01L 31/0735 |
| | | | 257/94 |
| 2009/0267078 A1 | 10/2009 | Mishra et al. | |
| 2010/0012976 A1 | 1/2010 | Hydrick et al. | |
| 2010/0012977 A1 | 1/2010 | Derluyn et al. | |
| 2010/0068866 A1 | 3/2010 | Yu et al. | |
| 2010/0072576 A1 | 3/2010 | Arena | |
| 2010/0140735 A1 | 6/2010 | Bommena et al. | |
| 2010/0207138 A1 | 8/2010 | Nakahata et al. | |
| 2010/0213511 A1 | 8/2010 | Lochtefeld | |
| 2010/0219452 A1 | 9/2010 | Brierley | |
| 2010/0270559 A1 | 10/2010 | Ota | |
| 2011/0037098 A1 | 2/2011 | Kim et al. | |
| 2011/0079822 A1 | 4/2011 | Kanamura | |
| 2011/0117726 A1 | 5/2011 | Pinnington et al. | |
| 2011/0210377 A1 | 9/2011 | Haeberlen et al. | |
| 2011/0272740 A1 | 11/2011 | Umeda et al. | |
| 2011/0278945 A1 | 11/2011 | Wheatley, III et al. | |
| 2011/0284865 A1 | 11/2011 | Inoue et al. | |
| 2012/0119218 A1 | 5/2012 | Su et al. | |
| 2012/0119220 A1 | 5/2012 | Guo et al. | |
| 2012/0248500 A1 | 10/2012 | Kajitana | |
| 2012/0292789 A1 | 11/2012 | Sazawa | |
| 2012/0305992 A1 | 12/2012 | Marino et al. | |
| 2013/0015460 A1 | 1/2013 | Chen et al. | |
| 2013/0015525 A1 | 1/2013 | Cheng | |
| 2013/0043468 A1 | 2/2013 | Adekore | |
| 2013/0043485 A1 | 2/2013 | Ueno | |
| 2013/0049013 A1 | 2/2013 | Shimada | |
| 2013/0105808 A1 | 5/2013 | Wong et al. | |
| 2013/0105810 A1 | 5/2013 | Nishimori et al. | |
| 2013/0146893 A1 * | 6/2013 | Thei | H01L 21/8258 |
| | | | 257/76 |
| 2013/0221409 A1 | 8/2013 | Nakajima et al. | |
| 2013/0228809 A1 | 9/2013 | Chang et al. | |
| 2013/0256679 A1 | 10/2013 | Yao et al. | |
| 2013/0270579 A1 | 10/2013 | Yu et al. | |
| 2013/0271208 A1 | 10/2013 | Then et al. | |
| 2013/0277686 A1 | 10/2013 | Liu et al. | |
| 2013/0307513 A1 | 11/2013 | Then et al. | |
| 2013/0313561 A1 | 11/2013 | Suh | |
| 2013/0320353 A1 | 12/2013 | Kryiouk et al. | |
| 2013/0334538 A1 | 12/2013 | Saunier | |
| 2014/0014966 A1 | 1/2014 | Tabatabaie et al. | |
| 2014/0042446 A1 | 2/2014 | Chiang | |
| 2014/0084300 A1 | 3/2014 | Okamoto | |
| 2014/0091308 A1 | 4/2014 | Dasgupta et al. | |
| 2014/0091310 A1 | 4/2014 | Jeon et al. | |
| 2014/0091398 A1 | 4/2014 | Hata et al. | |
| 2014/0091845 A1 | 4/2014 | Then et al. | |
| 2014/0094223 A1 | 4/2014 | Dasgupta et al. | |
| 2014/0110759 A1 | 4/2014 | Murata et al. | |
| 2014/0197459 A1 | 7/2014 | Kis et al. | |
| 2014/0203329 A1 | 7/2014 | Saitoh et al. | |

(56) References Cited

U.S. PATENT DOCUMENTS

| | | |
|---|---|---|
| 2014/0239312 A1 | 8/2014 | Shatalov et al. |
| 2014/0252368 A1 | 9/2014 | Lee et al. |
| 2014/0264321 A1 | 9/2014 | Liang |
| 2014/0264379 A1 | 9/2014 | Kub et al. |
| 2014/0264380 A1 | 9/2014 | Kub et al. |
| 2015/0014820 A1 | 2/2015 | Renaud |
| 2015/0041820 A1 | 2/2015 | Renaud |
| 2015/0041860 A1 | 2/2015 | Nishimori et al. |
| 2015/0061075 A1 | 3/2015 | Yeh |
| 2015/0061078 A1 | 3/2015 | Abel et al. |
| 2015/0083206 A1 | 3/2015 | Novoselov et al. |
| 2015/0103977 A1 | 4/2015 | Ono et al. |
| 2015/0115325 A1 | 4/2015 | Vielemeyer |
| 2015/0144957 A1 | 5/2015 | Lu et al. |
| 2015/0206796 A1 | 7/2015 | Dasgupta et al. |
| 2015/0263223 A1 | 9/2015 | Ito |
| 2015/0318276 A1 | 11/2015 | Bayram et al. |
| 2015/0340482 A1 | 11/2015 | Padmanabhan et al. |
| 2015/0364592 A1 | 12/2015 | Van Dal et al. |
| 2016/0111496 A1 | 4/2016 | Leobandung |
| 2016/0336437 A1 | 11/2016 | Kajitani et al. |
| 2017/0221999 A1 | 8/2017 | Dasgupta |
| 2017/0278959 A1 | 9/2017 | Then et al. |
| 2018/0175184 A1 | 6/2018 | Then et al. |

FOREIGN PATENT DOCUMENTS

| | | |
|---|---|---|
| CN | 102017160 | 4/2011 |
| CN | 102306658 | 1/2012 |
| CN | 102576663 | 7/2012 |
| CN | 103582938 | 2/2014 |
| EP | 1054442 | 11/2000 |
| JP | S5851575 | 3/1983 |
| JP | S6240778 | 2/1987 |
| JP | 11243253 | 9/1999 |
| JP | 11260835 | 9/1999 |
| JP | 2001230410 | 8/2001 |
| JP | 2002249400 | 9/2002 |
| JP | 200369010 | 3/2003 |
| JP | 2007165431 | 6/2007 |
| JP | 2007317794 | 12/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2011210751 | 10/2011 |
| JP | 2013128135 | 6/2013 |
| JP | 2014078653 | 5/2014 |
| JP | 2014131028 | 7/2014 |
| JP | 2014192167 | 7/2016 |
| KR | 20120048244 | 5/2012 |
| KR | 20130046249 | 5/2013 |
| KR | 1020140037702 | 3/2014 |
| KR | 101410092 | 6/2014 |
| TW | 201415626 | 4/2014 |
| WO | 2011064997 | 6/2011 |
| WO | 2015047355 | 4/2015 |
| WO | 2015147816 | 10/2015 |
| WO | 2016043748 | 3/2016 |
| WO | 2016048328 | 3/2016 |
| WO | 2016209263 | 12/2016 |

OTHER PUBLICATIONS

Extended European Search Report for European Patent Application No. 14902161.0, dated Mar. 22, 2018.
International Search Report and Written Opinion for PCT/US14/56299 dated Jun. 16, 2015, 14 pages.
Decision of Refusal dated Jan. 24, 2019 for Japanese Patent Application No. 2017-508522.
Non-Final Office Action for U.S. Appl. No. 15/504,634, dated Feb. 23, 2018.
Notice of Allowance from Taiwan Patent Application No. 104126253 dated Mar. 26, 2019, 3 pgs.
Notice of Reasons for Rejection for Japan Patent Application No. 2017-508522, dated Jun. 6, 2018.
Office Action & Search Report dated Nov. 20, 2018 for Taiwan Patent Application No. 104126253.
Office Action dated Jun. 6, 2018 for Japanese Patent Application No. 2017-508522.
Office Action dated Oct. 4, 2018 for Japanese Patent Application No. 2017-508522.
PCT Application No. PCT/14/56299, filed Sep. 18, 2014.
Restriction Requirement for U.S. Appl. No. 15/504,634, dated Aug. 30, 2017.
Notice of Allowance dated Feb. 7, 2019 for U.S. Appl. No. 15/504,634.
Guo, Jia et al. "MBE-Regrown Ohmics in InAlN HEMTs With a Regrowth Interface Resistance of 0.05Ω mm", IEEE Electron Device Letters, vol. 33, No. 4, Apr. 2012, 3 pgs.
Hahn, H. et al. "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.
Katona, T.M. et al. "Control of crystallographic tilt in GaN grown on Si (111) by cantilever epitaxy", Applied Physics Letters, vol. 81, No. 19, Nov. 4, 2002, 3 pgs.
Masui, Hisashi et al. "Geometrical Characteristics and Surface Polarity of Inclined Crystallographic Plane of the Wurzite and Zincblende Structures", Journal of Electronic Materials, vol. 38, No. 6, 2009.
Takei, Y. et al. "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.
Wan, J. et al. "Growth of Crack-Free Hexagonal GaN Films ON SI (100)", Applied Physics Letters, USA, Jul. 18, 2001, Vo. 79, No. 10. p. 1459-1460, DOI: 10.1063/1.1400770.
Examination Report from Malaysian Patent Application No. PI2017700505 dated Apr. 23, 2020, 3 pgs.
Office Action from Chinese Patent Application No. 201480081257.2 dated Jan. 6, 2020, 28 pgs.
Gupta, P. et al., "Layered Transition Metal Dichalcogenides: Promising Near-Lattice-Matched Substrates for GaN Growth", Scientific Reports vol. 6, Article No. 23708 (2016); doi:10.1038/srep23708, Mar. 30, 2016, 23 pgs.
Notice of Allowance from Chinese Patent Application No. 201480081257.2 dated Jun. 30, 2020, 7 pgs.
Office Action from Korean Patent Application No. 10-2017-7004128 dated Aug. 28, 2020, 18 pgs.

\* cited by examiner

| Param. / Growth | ↑ Growth Temp | ↑ Growth Pressure | ↑ V:III Ratio |
|---|---|---|---|
| Inclined Sidewall Plane | ↓ | ↑ | ↑ |
| Non-inclined Sidewall Plane | ↑ | ↓ | ↓ |

WURTZITE HETEROEPITAXIAL STRUCTURES WITH INCLINED SIDEWALL FACETS FOR DEFECT PROPAGATION CONTROL IN SILICON CMOS-COMPATIBLE SEMICONDUCTOR DEVICES

CLAIM OF PRIORITY

This application is a Continuation of, and claims priority to, U.S. patent application Ser. No. 15/504,634, filed 16 Feb. 2017, which is a National Phase Application of, and claims priority to, PCT Patent Application No. PCT/US14/56299, filed 18 Sep. 2014, both of which are incorporated by reference in entirety for all purposes.

TECHNICAL FIELD

Embodiments of the invention generally relate to control of defects within wurtzite materials heteroepitaxially formed on cubic substrates, and more particularly pertain to III-N semiconductor heterostructures with inclined semi-polar sidewall facets.

BACKGROUND

Demand for integrated circuits (ICs) in portable electronic applications has motivated greater levels of semiconductor device integration. Many advanced semiconductor devices in development leverage non-silicon semiconductor materials, a subset of which have wurtzite crystallinity. Exemplary wurtzite materials include AgI, ZnO, CdS, CdSe, α-SiC, BN, GaN, AlN, InN the last three of which may be grouped together as being in the III-N material system. The III-N material system shows particular promise for high voltage and high frequency applications like power management ICs and RF power amplifiers. III-N heteroepitaxial (heterostructure) field effect transistors (HFET), such as high electron mobility transistors (HEMT) and metal oxide semiconductor (MOS) HEMT, employ a semiconductor heterostructure with one or more heterojunction, for example at an interface of a GaN semiconductor and another III-N semiconductor alloy, such as AlGaN or AlInN. GaN-based HFET devices benefit from a relatively wide bandgap (~3.4 eV), enabling higher breakdown voltages than Si-based MOSFETs, as well as high carrier mobility. The III-N material system is also useful for photonics (e.g., LEDs), photovoltaics, and sensors, one or more of which may be useful to integrate into an electronic device platform.

Multi-chip integration approaches have been employed to integrate silicon-based devices with those based on wurtzite semiconductor materials. These multi-chip approaches have scaling and performance limitations. Monolithic integration of silicon-based devices (e.g., CMOS field effect transistors) with devices utilizing wurtzite material systems is a challenge due to a large lattice mismatch (e.g., ~41% between GaN and Si) and a large thermal expansion coefficient mismatch (e.g., ~116% between Si and GaN). These mismatches can result in a great number of defects in the wurtzite semiconductor thin films epitaxially grown on silicon substrates. Without an ability to control propagation of defects, regions of sufficiently low defect density may not available to form highly functional semiconductor devices. One technique for monolithic integration relies on thick buffer layers, for example of 3-10 microns, or more. Such thick buffers however are expensive and complicate silicon CMOS integration. Structures and techniques to manage defect propagation in wurtzite material systems heteroepitaxially formed on CMOS-compatible substrates without thick buffers are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
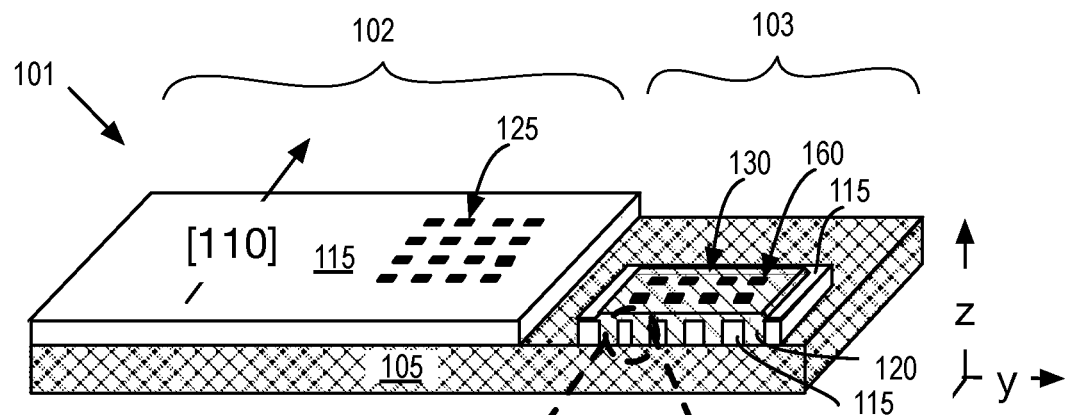
FIG. 1A is an isometric view of a System-on-Chip (SoC) including silicon-based MOSFETs on silicon and III-N HFETs on a faceted III-N heterostructure having inclined sidewalls, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are wurtzite heteroepitaxial structures with inclined sidewall facets, and lateral overgrowth techniques for forming such structures. As described below, such structures and techniques offer a measure of control over defect propagation within the wurtzite crystalline material heteroepitaxially formed on a substrate of differing crystallinity. In particularly advantageous embodiments, and as further exemplified below, defects may be propagated away from a device layer as a means of reducing the defect density within active semiconductor device layers disposed over the heteroepitaxial structure. In embodiments, an epitaxial growth process with a significant lateral growth rate is utilized to bend the direction of defect propagation away from the wurtzite crystal c-axis and provide for a device layer of a desired defect density at heteroepitaxial film thicknesses significantly below the thick (e.g., 1-3 µm) heteroepitaxial buffer layers typically utilized. As also described below, the geometric profiles of a heteroepitaxial structure incorporating inclined sidewall facets in accordance with embodiments may be utilized primarily for control of defect propagation, or these semi-polar surfaces may be further leveraged within a functional device structure, for example to additively form non-planar devices such as multi-gate FETs, diodes, etc.

In further embodiments, template structures formed on a cubic substrate surface, such as a silicon surface, may be aligned along a desired cubic crystal plane so that lateral overgrowth conditions utilized to form a heteroepitaxial structure from the template structures may be tuned to bend defects away from a wurtzite c-plane device surface in a manner that permits the formation of devices having a current carrying direction that is compatible with the current carrying direction of silicon MOSFETs formed on an adjacent portion of the substrate surface, thereby facilitating dense SoC architectures.

FIG. 1A is an isometric view of an SoC 101 including silicon-based MOSFETs 125 disposed over a first cubic semiconductor surface region 102. SoC 101 further includes III-N-based HFETs 160 on an elevated III-N semiconductor 130 having inclined sidewall facets disposed over a second cubic semiconductor surface region 103, in accordance with an embodiment. Together, the elevated III-N semiconductor 130 and cubic semiconductor surface region 102 form a semiconductor heterostructure. Notably, the exemplary embodiments are described in the context of the III-N material system (e.g., AlN, GaN, AlGaN, InAlGaN, etc.) for clarity of presentation. However, the inventors currently understand the structures and techniques described herein to be broadly applicable to a family of wurtzite semiconductors further including at least AgI, ZnO, CdS, CdSe, α-SiC, and BN. As such, it is expected one of skill in the art familiar with the characteristics of an alternate wurtzite semiconductor material will be able to successfully apply the techniques described herein absent some specific a prior knowledge of a salient incompatibility between the exemplary III-N material system described herein and the alternate wurtzite material system. Also for clarity, the exemplary embodiments provide great detail in the context of III-N HFETs. However, the inventors currently understand the structures and techniques described herein to be broadly applicable to a family of semiconductor devices including at least transistors (e.g., further including HBTs) and (photo)diodes for LED, photonic, or photovoltaic applications. As such, it is expected one of skill in the art familiar with the characteristics of an alternate semiconductor device will be able to successfully apply the techniques described herein absent some specific a prior knowledge of a salient incompatibility between the exemplary HFET device(s) described herein and the alternate device(s).

Continuing with FIG. 1A, elevated III-N semiconductor structure 130 is disposed over a cubic semiconductor surface, which in the exemplary embodiment is a surface region of substantially monocrystalline substrate 105 having a predetermined crystal orientation. Substrate 105 may be a variety of materials, including, but not limited to, silicon, germanium, SiGe, III-V compounds like GaAs, InP and 3C—SiC. In the exemplary embodiment substrate 105 is silicon, which is advantageous for monolithic integration of HFETs 160 with conventional silicon MOSFETs 125. Crystallographic orientation of a substantially monocrystalline substrate 105 may be any of (100), (111), or (110). Other crystallographic orientations are also possible. In one exemplary silicon substrate embodiment, substrate 105 is (100) silicon. For a (100) silicon substrate 105 the semiconductor surface may be miscut or offcut, for example 2-10° toward [110], to facilitate nucleation of elevated III-N semiconductor structure 130 with wurtzite crystallinity.

Also disposed over the substrate semiconductor surface is a trench material 115. Trench material 115 can be of any dielectric known to provide sufficient electrical isolation between adjacent monolithically integrated semiconductor devices. In the exemplary embodiment trench material 115 is an isolation dielectric, such as, but not limited to silicon oxides (SiO), silicon nitrides (SiN), silicon oxynitrides (SiON), silicon carbonitrides (SiCN), or low-k materials (e.g., carbon doped silicon dioxide (SiOC), porous dielectrics, etc.). In embodiments, trench material 115 is patterned into stripes of dielectric material with regions of the substrate semiconductor surface disposed between the stripes. In one exemplary embodiment where the substrate is (100) silicon, the trenches and stripes of dielectric material have their longest lengths aligned with the <110> direction.

Figure 1B:
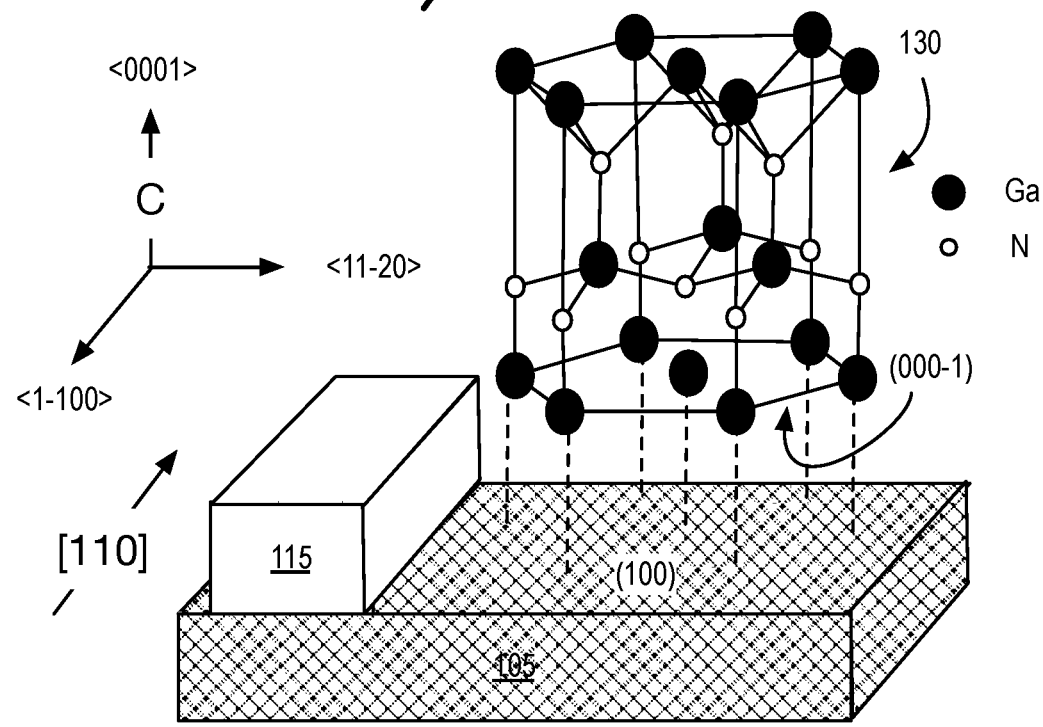
FIG. 1B is an expanded isometric view of a III-N heteroepitaxial crystal disposed on CMOS-compatible silicon substrate, in accordance with an embodiment.

FIG. 1B is an expanded isometric view of the SoC 101 further illustrating a GaN heteroepitaxial crystal disposed over a CMOS-compatible silicon substrate 105, in accordance with an embodiment. Substrate 105 is CMOS-compatible both because of the (100) crystal orientation and because the patterned device features are biased to a <110> direction. As described further below, with the elevated semiconductor 130 disposed within trench sidewalls that are aligned with the <110> direction, devices based on the III-N heterostructure 130 (e.g., HFETs 160) may be formed with their current carrying direction aligned to that of MOSFETs 125. Such directional alignment between the monolithically integrated III-N devices and silicon devices optimizes performance of the MOSFETs 125 and simplifies integration of the III-N devices into SoC 101. As further illustrated in FIG. 1B, the c-axis of elevated III-N semiconductor structure 130 is ideally aligned approximately normal to a (100) substrate semiconductor surface. Practically, however the c-axis may be slightly tilted, for example a few degrees less than normal to a (100) silicon substrate plane, as a result of imperfect epitaxial growth on a miscut substrate. Wurtzite crystallinity lacks inversion symmetry, and more particularly the {0001} planes are not equivalent. For the exemplary GaN crystal illustrated in FIG. 1B, one of the {0001} planes is typically referred to as the Ga-face (+c polarity) and the other referred to as the N-face (–c polarity). In the exemplary embodiment, the {000-1} plane is more proximate the semiconductor surface of substrate 105 and elevated III-N semiconductor structure 130 may be referred to as Ga polarity (+c) because the three bonds of Ga (or other group III element) point towards substrate 105. For alternate embodiments where the three bonds of Ga (or other group III element) point away from the substrate, elevated III-N semiconductor structure 130 would be referred to as N polarity (–c).

Figures 2A, 2B:
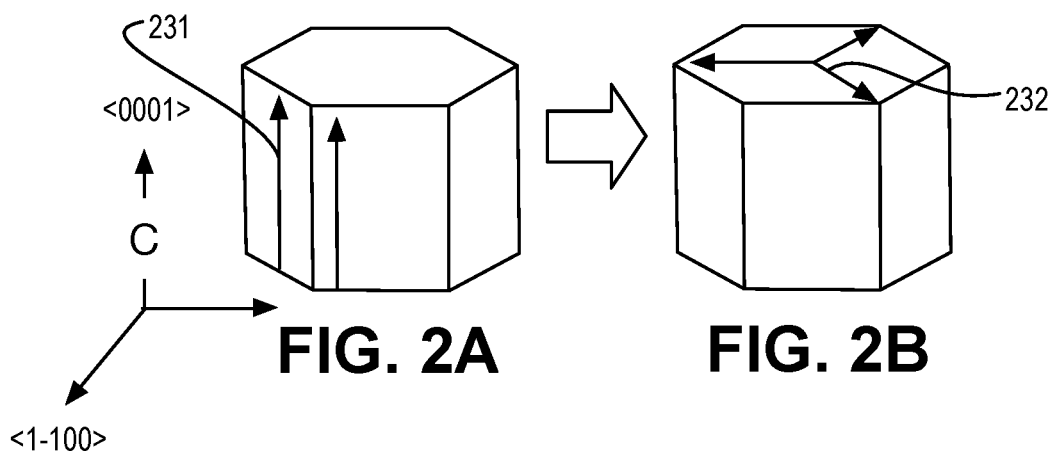
FIGS. 2A and 2B are isometric views of directions and planes along which threading dislocations in wurtzite material systems can propagate.

Noting there is significant lattice mismatch between the exemplary silicon substrate surface and exemplary III-N heterostructure, crystal defects, such as threading dislocations may be present in elevated III-N semiconductor structure 130. FIGS. 2A and 2B are isometric views of directions and planes along which threading dislocations in wurtzite material systems can propagate or glide. As shown in FIG. 2A, threading dislocations 231 glide vertically, parallel to the c-axis along a (1-100) slip plane. With the c-axis oriented approximately as illustrated in FIG. 1B, such vertical defect propagation may be disadvantageous because defect density proximal the surface of a III-N heterostructure is then only a weak function of the thickness, or z-height of the III-N heterostructure. As shown in FIG. 2B, threading dislocations 232 glide non-parallel to the c-axis, along a (0001) slip plane. With the c-axis oriented as illustrated in FIG. 1B, such lateral or horizontal defect propagation is advantageous because defect density proximal the surface of a III-N heterostructure is then a stronger function of the thickness, or z-height, of the III-N heterostructure. Lower defect densities at a top surface parallel to the c-plane are then possible for a given III-N thin film thickness.

In embodiments, elevated III-N semiconductor structure 130 (FIG. 1A) includes a crystal defect, such as a threading dislocation, which bends from a vertical (e.g., parallel to c-axis) direction of propagation proximal to a non-vertical direction of propagation (e.g., perpendicular to c-axis). A bending dislocation changes its direction of propagation from that illustrated in FIG. 2A to that illustrated in FIG. 2B within an elevated III-N semiconductor structure. In exemplary embodiments, lateral epitaxial overgrowth (LEO) of the wurtzite material is utilized to bend and glide dislocations laterally away from the underlying trench within which the III-N heterostructure interfaces with the substrate semiconductor surface. This is in contrast to a LEO structure where vertical defect propagation is maintained in an effort to reduce the defect density within the laterally grown III-N material.

Figure 3A:
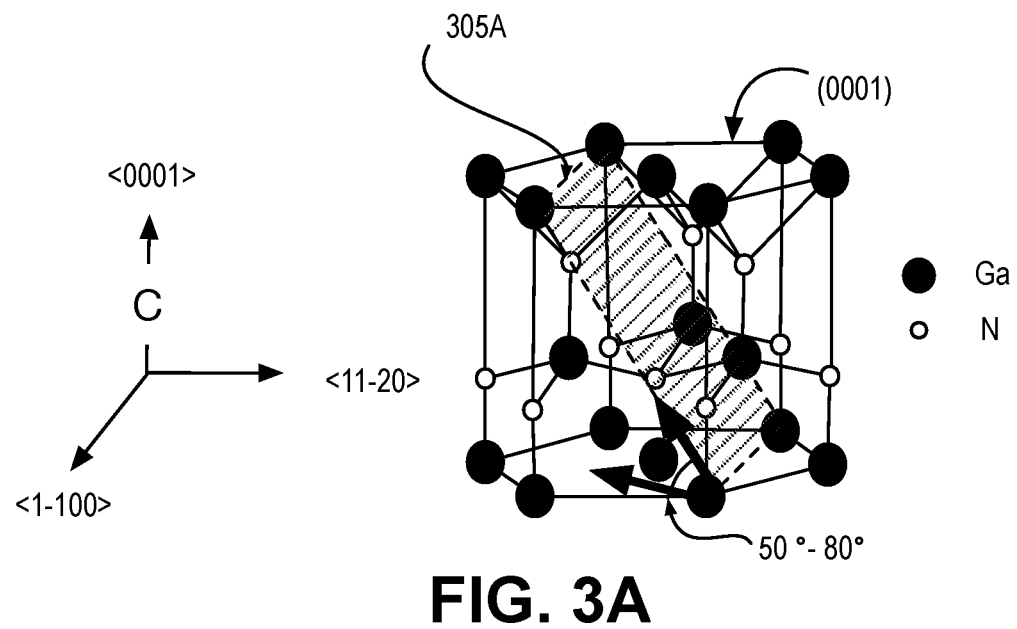
FIGS. 3A and 3B are isometric views of inclined crystal planes utilized for defect propagation and control in embodiments of the present invention.
Figure 3B:
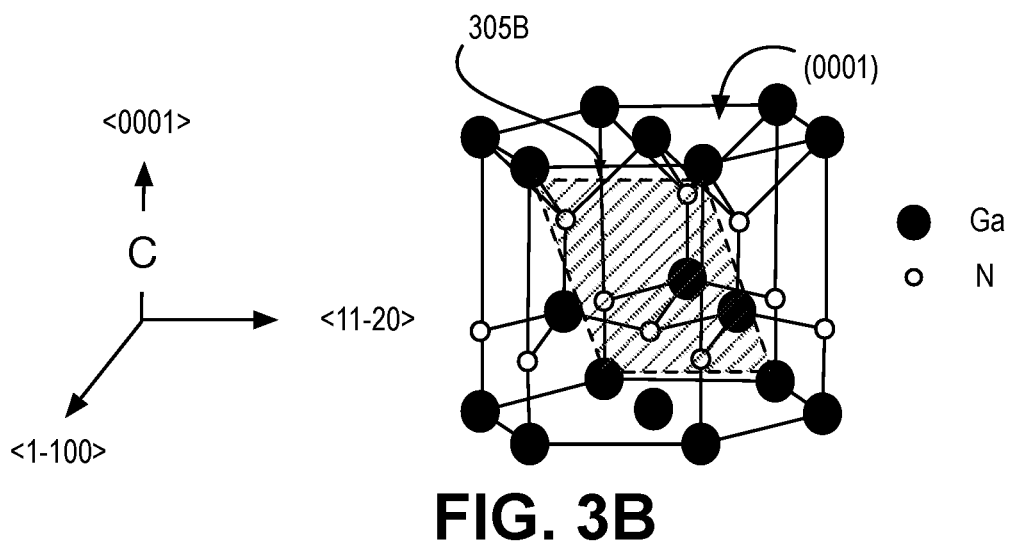

In embodiment, elevated III-N semiconductor structure 130 has inclined sidewall facets that are non-parallel and non-normal to the c-axis. The inclined sidewall facets are indicative of LEO techniques in accordance with embodiments of the present invention, which advantageously bend the crystal defect direction of away from the c-axis. The inclined sidewall facets are advantageously semi-polar planes that intersect the c-plane (0001) at between 50° and 80°. FIGS. 3A and 3B are isometric views of two exemplary inclined crystal planes that may be utilized for defect propagation and control in embodiments of the present invention. FIG. 3A illustrates an inclined semi-polar plane 305A, which is a {11-22} plane and approximately 58.4° from the c-plane (0001). FIG. 3B illustrates another exemplary inclined semi-polar plane 305B, which is a {1-101} plane and approximately 61o from the c-plane (0001). In exemplary embodiments, elevated III-N semiconductor structure 130 (FIG. 1A) has inclined sidewall facets along either of the semi-polar planes 305A or 305B, or their equivalent planes. The inventors have found semi-polar planes that are at approximately 60° relative to the c-plane particularly advantageous for controlling propagation of defects within laterally overgrown III-N materials. However, other inclined planes that intersect the c-plane anywhere between 50° and 80° may also be utilized in alternative embodiments. For example, in one alternative embodiment, elevated III-N semiconductor structure 130 has inclined sidewall facets following the semi-polar plane {20-21}, which has an angle of approximately 75° relative to the c-plane (e.g., 0001).

Figure 4A:
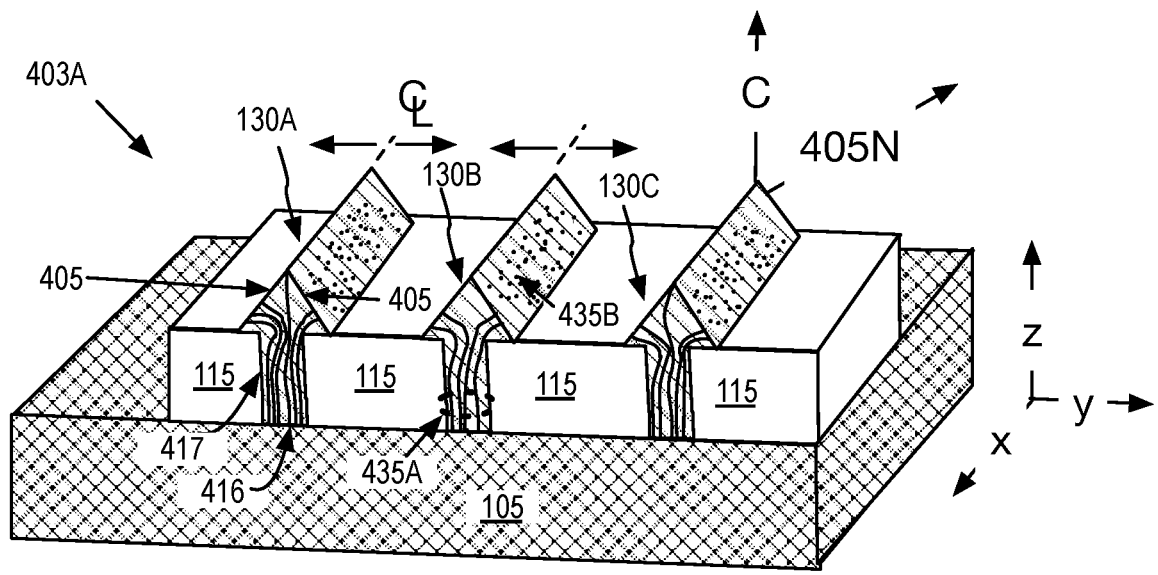
FIGS. 4A, 4B, 4C, and 4D are isometric views of III-N heterostructures having inclined sidewall facets, in accordance with embodiments.

FIGS. 4A, 4B, 4C, and 4D are isometric views of semiconductor heterostructures including elevated III-N semiconductor structures having inclined sidewall facets, in accordance with embodiments. Each of the semiconductor heterostructures may be found for example disposed over the semiconductor surface region 103 illustrated in FIG. 1A. Referring first to FIG. 4A, an exemplary semiconductor heterostructure 403A includes a plurality of elevated semiconductor structures 130A, 130B, 130C extending out of a plurality of trenches formed of trench material 115. Each of the trenches exposes a semiconductor surface of substrate 105 between adjacent stripes of trench material 115. For example, elevated semiconductor structure 130A is disposed within trench 416 and extends to a top surface having a z-height greater than that of trench sidewall, 417. Elevated III-N semiconductor structure 130A includes a pair of sidewall facets 405 from a top surface of elevated III-N semiconductor structure 130A to an interface with the trench material 115 disposed laterally beyond the trench sidewall 417. Sidewall facets 405 intersect, forming a peaked III-N semiconductor structure profile in the y-z plane. For such an elevated III-N semiconductor structure, the only c-plane present is at the apex at the centerline of each elevated III-N semiconductor structure. Sidewall facets 405 may be any of those described in the context of FIG. 3A, 3B, for example having a normal vector 405N that is approximately 60° from the c-axis.

In embodiments, an elevated III-N semiconductor structure includes a plurality of threading dislocations extending from the exposed surface of the substrate semiconductor, through a z-height of the trench and bending toward one of the pair of inclined sidewall facets. Such defect propagation control is further illustrated in FIG. 4A with at least some of threading dislocation defects 435A vertically gliding within trench 416, bending away from the c-axis at z-heights above trench material 115, and horizontally gliding to inclined sidewall facets 405 (illustrated in FIG. 4A as point defects 435B). Defects 435A illustrated in FIG. 4A are a representation of defect bending that can be readily observed with electron microscopy (e.g., TEM).

Figure 4B:
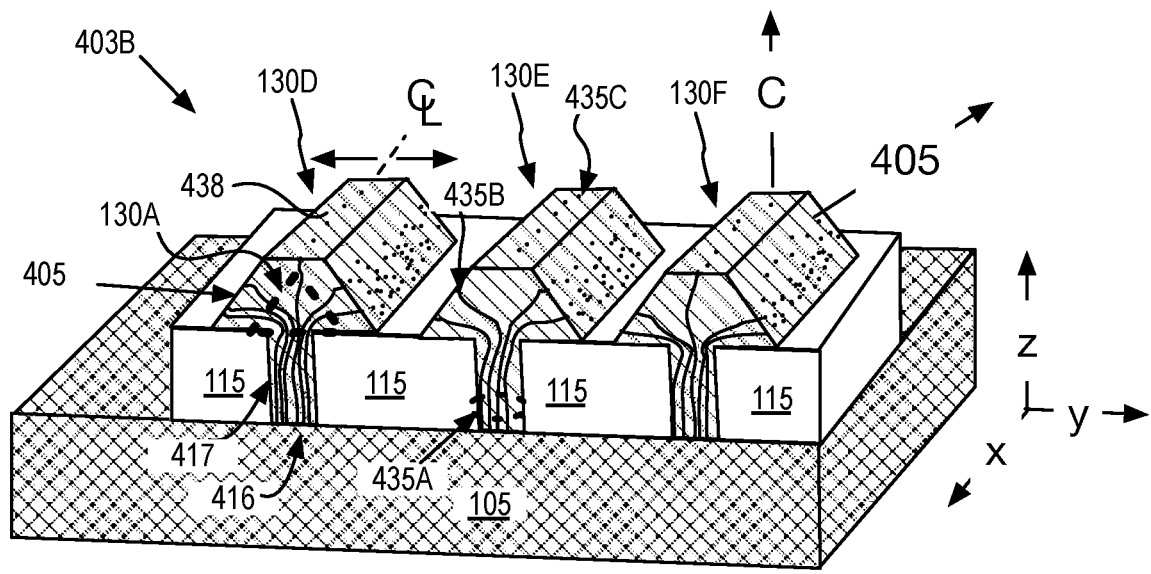

FIG. 4B illustrates an exemplary semiconductor heterostructure 403B including a plurality of elevated III-N semiconductor structures 130D, 130E, and 130F, each having inclined sidewall facets 405 substantially as described above in the context of FIG. 4A. Instead of intersecting at an apex, pairs of sidewall facets 405 are separated by a top surface 438 that is substantially parallel with the c-plane. A dashed line in FIG. 4B demarks the III-N semiconductor structure 130A from FIG. 4A. III-N semiconductor structures 130D, 130E, and 130F have a significantly larger lateral width (e.g., along y-dimension in FIG. 4B) than do III-N semiconductor structures 130A, 130B, and 130C depicted in FIG. 4A. III-N semiconductor structures 130D, 130E, and 130F illustrate lateral expansion of III-N semiconductor structures 130A, 130B, and 130C that is a result of additional LEO. Notably, the LEO process employed has greater lateral (y-axis) growth than vertical (z-axis) growth. However, with non-zero vertical growth, the defect density proximal the top surface 138 decreases as the elevated III-N semiconductor structures expand laterally. As shown in FIG. 4B, because most defects 435A are bent from vertical propagation to lateral propagation during lateral overgrowth, most defects are propagated toward inclined sidewall facets 405 with only those defects 435C that are very close to the centerline of trench 416 able to enter into uppermost portion of III-N semiconductor structures 130D, 130E, and 130F. Hence, as the LEO process is continued defect density proximal the top surface 138 decreases.

Figure 6A:
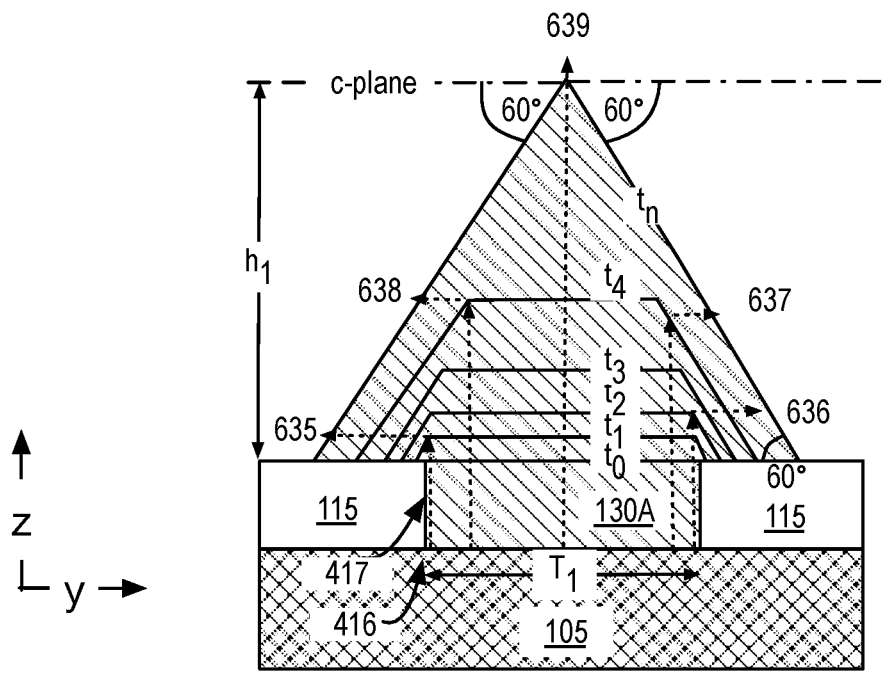
FIGS. 6A and 6B are cross-sectional views illustrating defect propagation within faceted III-N heterostructures as a function of both epitaxial growth time and trench width, in accordance with embodiments.
Figure 6B:
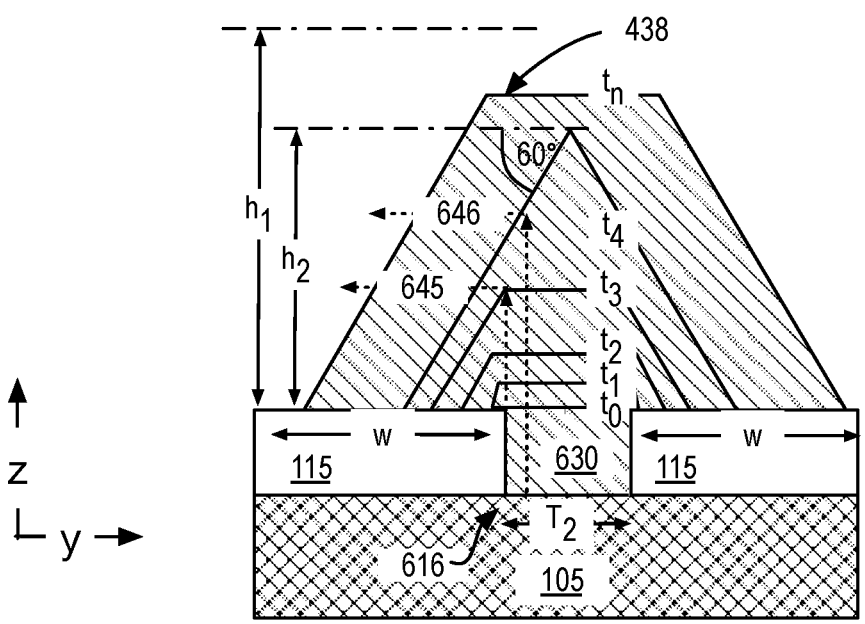

FIGS. 6A and 6B are cross-sectional views of defect propagation within faceted III-N heterostructures as a function of both growth time and trench width, in accordance with embodiments. FIGS. 6A and 6B also illustrate how a threading dislocation bends toward one of the inclined sidewall facets at a z-height that is dependent on defect's proximity to a trench sidewall. In FIG. 6A, a profile of elevated III-N semiconductor structure 130A is illustrated for LEO time $t_0$, $t_1$, $t_2$, $t_3$, $t_4$ and $t_n$. The profile at time to corresponds to a point when elevated III-N semiconductor structure 130A is just ready to emerge from trench 416, which has a lateral width $w_1$. At time to defects 635, 636, 637, 638, and 639 within elevated III-N semiconductor structure 130A are propagating in the vertical direction (e.g., substantially parallel to the c-axis), as denoted by dashed lines. At time $t_1$, after an initial duration of LEO, III-N semiconductor structure 130A has expanded over trench sidewall 417 and the inclined sidewall facet(s) favored by the LEO conditions emerges. Defect 635 most proximal to trench sidewall 417 is intersected by an inclined sidewall facet and the direction of the defect's propagation becomes lateral (e.g., substantially parallel to the c-plane). At time $t_2$, III-N semiconductor structure 130A has continued to expand laterally over trench material 115 and increased in z-height while maintaining the favored inclined sidewall facet that now intersects defect 636, which until time $t_2$ had been propagating vertically. Defect 636, in next nearest proximity to a trench sidewall, begins to propagate laterally (e.g., substantially parallel to the c-plane) at time $t_2$. At time $t_3$, III-N semiconductor structure 130A has continued to expand laterally over trench material 115 and increased in z-height while maintaining the favored inclined sidewall facet that now intersects defect 637, which until time $t_3$ had been propagating vertically. At time $t_3$ the direction of propagation of defect 637 becomes lateral (e.g., substantially parallel to the c-plane). This bending of defect propagation continues (e.g., bending defect 638 at time $t_4$) until the inclined sidewall facets favored by the LEO process (e.g., ~60°) intersect each other at time $t_n$ to form a peaked elevated III-N structure 130A with an apex at height $h_1$. After time $t_n$, only defect 639 nearly coincident with a centerline of trench 416 continues to vertically propagate.

FIG. 6B illustrates a similar time progression of an elevated III-N semiconductor structure 630, which is epitaxially grown from a trench 616 that has a trench width $T_2$ smaller than trench width $T_1$ illustrated in FIG. 6A. As shown in FIG. 6B, elevated III-N semiconductor structure 630 reaches an apex earlier, at time $t_4$ and at a z-height of $h_2$, which is less than $h_1$. Hence, as of time $t_4$, nearly all defects (e.g., 645, 646) have been redirected so that at time $t_n$, additional LEO increases z-height with low defect density material having a top surface 636 that is substantially planar with the c-plane.

Based on the mechanism illustrated in FIGS. 6A and 6B, trench width w should be reduced to advantageously reduce the z-height of raised III-N semiconductor structures well below the thicknesses typically required for buffer layers. Furthermore, to reduce the LEO growth time, spacing between adjacent trenches may be reduced. Trench width and spacing dimensions are a function of the angle of the inclined sidewall facet favored by a given LEO process and may be predetermined to reasonable accuracy as a matter of geometry. For example, referring to FIG. 6A where the inclined sidewall facet is a (1-101) plane at approximately 60° from the c-plane, it can be shown:

$$h_1 \sim \frac{\sqrt{3}}{2} T_1 \qquad (1)$$

where $T_1$ is the trench width. After reaching height $h_1$, with additional LEO time, the low defect density top surface 438 illustrated in FIG. 6B increases in lateral width until adjacent raised III-N semiconductor structures (e.g., structures 130E, 130F, 130G in FIG. 4B) merge in the raised III-N semiconductor structure 430 illustrated in FIG. 4C.

Figure 4C:
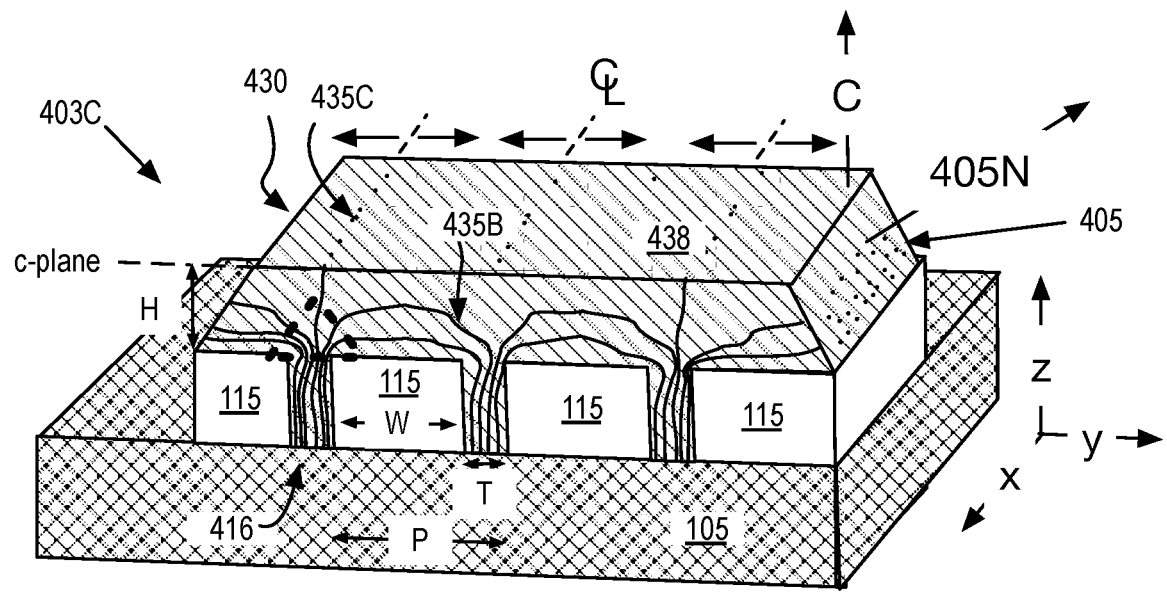

For semiconductor heterostructure 403C illustrated in FIG. 4C, raised III-N semiconductor structure 430 is at a z-height H where additional LEO has caused adjacent III-N semiconductor structures to laterally merge into an arbitrarily large top surface 438. Top surface 438 has a low defect density including predominantly those defects 435C that continue to propagate vertically. In an exemplary embodiment, top surface 438 has a surface defect density (e.g., measured as etch pits/cm² or by plan-view TEM measurements) that is at least an order or magnitude lower than that of inclined sidewall facet 405. Top surface 438 is substantially parallel with the c-plane in the exemplary embodiment and extends between the adjacent trenches 416 and 418. The z-height H is a function of $h_1$ from FIG. 6A as described above, and a further function of the ratio of lateral growth rate:vertical growth rate of the LEO process and half the trench pitch p illustrated in FIG. 4C, which is the sum of the width W of trench material 115 and trench width T). In the exemplary embodiment illustrated in FIG. 4C, raised semiconductor structure 430 has a z-height H that is no greater than $h_1$ (e.g., $$\frac{\sqrt{3}}{2} T_1$$

from FIG. 6A) summed with half of the pitch p, which corresponds to a 1:1 ratio of lateral growth rate:vertical growth rate. As the ratio of lateral growth rate:vertical growth rate is increased, for example to 1.5 or 2.0, z-height H can be reduced to $h_1$ summed with a third or fourth of the pitch p, respectively. Hence, the height H is indicative of the LEO growth rate ratio. The growth rate ratio is therefore determinable for a given structure in accordance with embodiments through a measurement of height H combined with a measurement of the angle of the inclined sidewall facet 405, trench width T, and trench material width W.

Figures 6C, 7:
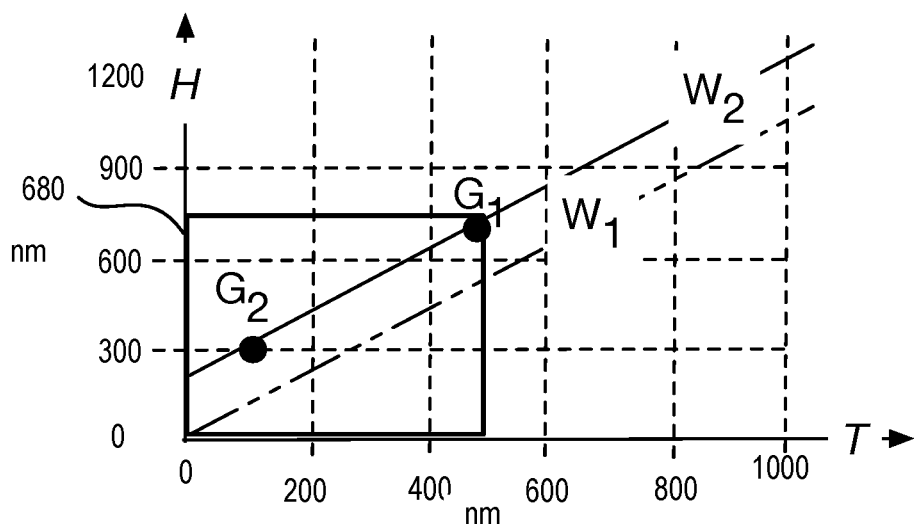
FIG. 6C illustrates dependence between the z-height of a faceted III-N heterostructure and a substrate trench width, in accordance with embodiments.
FIG. 7 is a trend matrix illustrating effects of GaN epitaxial growth conditions on crystal faceting during a lateral growth phase, in accordance with embodiments.

In exemplary embodiments, a raised III-N semiconductor structure having inclined sidewall facets and a c-plane top surface extending between at least two adjacent trenches, has a z-height less than 1 μm, advantageously less than 750 nm, and more advantageously less than 500 nm. In further embodiments, a raised III-N semiconductor structure having inclined sidewall facets and a c-plane top surface extending between at least two adjacent trenches, has a z-height H less than 750 nm, and a trench width T less than 500 nm. FIG. 6C illustrates an exemplary dependence of the z-height H for faceted III-N heterostructure 430 on substrate trench width T in accordance with the embodiment illustrated in FIG. 4C. Box 680 highlights those embodiments where the III-N semiconductor structure is advantageously no more than 750 nm. Two curves are shown in FIG. 6C, one for a trench material width $W_1$, and another for a trench material width $W_2$ that is larger than $W_1$. Even for the larger trench material width $W_2$, all trench widths T are below 500 nm within box 680.

Figure 4D:
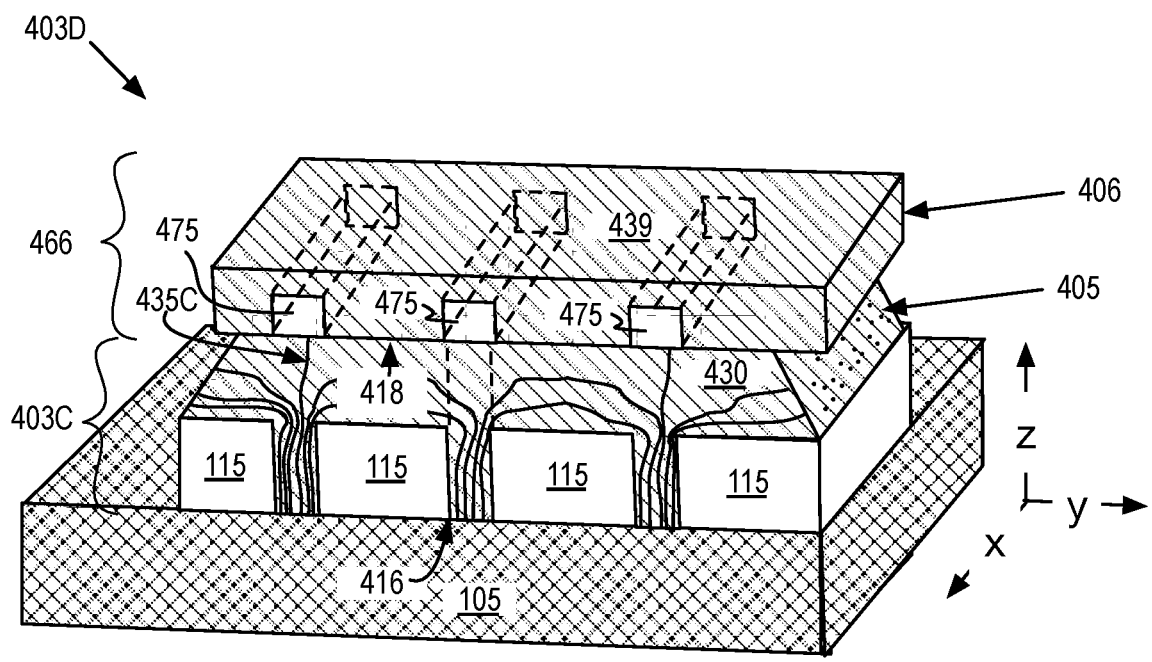

In further embodiments, raised III-N semiconductor structures having inclined sidewall facets are further augmented with a secondary III-N semiconductor cap structure as illustrated in FIG. 4D. Semiconductor heterostructure 403D includes a III-N semiconductor cap 466 disposed over the semiconductor heterostructure 403C described above. In the exemplary embodiment III-N semiconductor cap 466 is of the same material as raised III-N semiconductor 430 (e.g., GaN), however another III-N material may be utilized in the alternative. Embedded within III-N semiconductor cap 466 is a plurality of trench material stripes 475 aligned in the z-dimension with trenches 416 as denoted by dashed lines in FIG. 4D. Trench material stripes 475 may have lateral dimensions approximately equal $t_0$, or greater than those of trenches 416. Trench material stripes 475 may be of any of the materials described for trench material 115, such as, but not limited to silicon dioxide, silicon nitride, or similar dielectric material.

As further illustrated in FIG. 4D, defects 435C that continue to propagate in vertical direction terminate at a trench material stripe 475. As a result, stacked heterostructure 403D may provide a top surface 439 with even lower defect density than top surface 438 (FIG. 4C). In one exemplary embodiment, etch pit density (EPD) on top surface 439 is at least two orders of magnitude lower than that of an inclined sidewall facet. III-N semiconductor cap 466 is epitaxial to raised III-N semiconductor 430 and is of low defect density as a result of a good quality seeding surface (e.g., top surface 438) exposed within trenches 418. As a result of a second LEO process, III-N semiconductor cap 466 fills in trenches 418, extends over sidewalls of trenches 418, over trench material stripes 475, and overhangs inclined sidewall facets 405. III-N semiconductor cap 466 has sidewall facets 406 that depend on conditions of this secondary LEO process. In one exemplary embodiment where defect density of raised III-N semiconductor 430 not covered by trench material stripes 475 is of sufficient quality, any known LEO process may be employed and sidewall facets 406 may therefore follow a different plane than the inclined sidewall facets 405. For example facets 406 may follow an m-plane parallel to the c-axis.

In embodiments, a semiconductor heterostructure includes one or more semiconductor device layer disposed over at least one of an inclined sidewall facet or a c-plane surface of the elevated semiconductor structure. For example, a device layer may be disposed over any of the exemplary semiconductor heterostructures 403A, 403B, 403C, or 403D. The semiconductor device layer may be one or more material layer, such as but not limited to semiconductor channel layers (e.g., GaN), semiconductor polarization layers (e.g., AlN, AlInN, AlGaN, InGaN), semiconductor tunneling layers, semiconductor quantum well structures, and the like. In exemplary III-N HFET embodiments, semiconductor device layers include a semiconductor polarization layer, such as, but not limited to AlGaN, deposited over a III-N channel layer, such as, but not limited to, GaN.

In embodiments, a semiconductor device includes any of the semiconductor heterostructures described above with one or more device terminal coupled to one or more semiconductor device layer disposed over at least one inclined sidewall facet or a c-plane surface of the elevated semiconductor structure separating the inclined sidewall facets. For devices sensitive to defect density, device terminals may be disposed only over portions of an elevated III-N semiconductor structure of sufficiently low defect density (e.g., c-plane top surface). For devices insensitive to defect density, device terminals may be additionally, or exclusively, disposed over lower portions of inclined sidewall facets. FIGS. 5A, 5B, 5C, and 5D are isometric views of semiconductor devices in accordance with embodiments that incorporate the elevated III-N semiconductor structures illustrated in FIGS. 4A, 4B, 4C, and 4D, respectively.

Figure 5A:
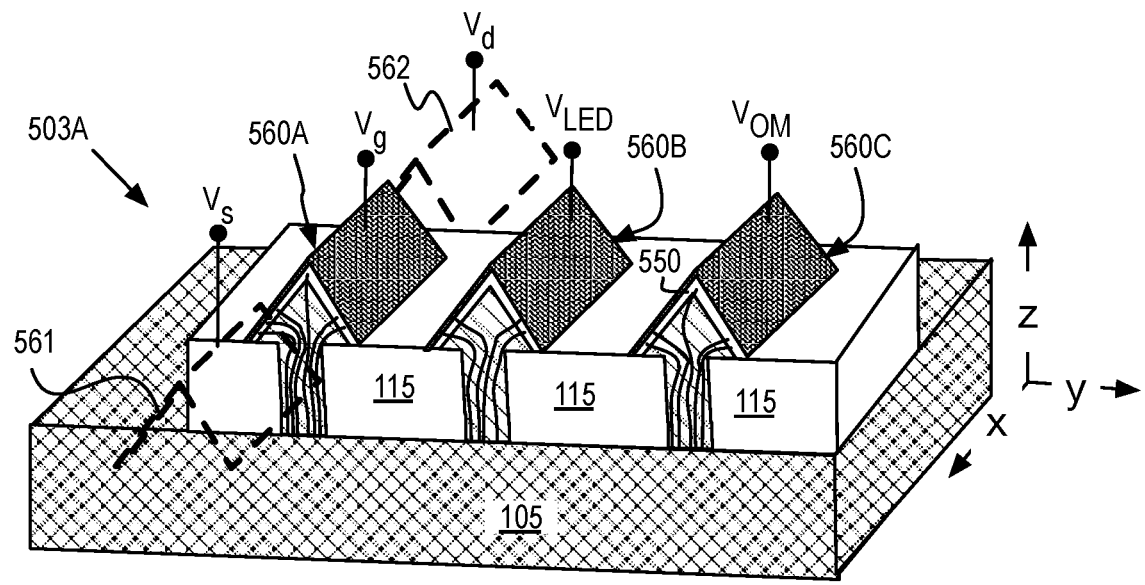
FIGS. 5A, 5B, 5C, and 5D are isometric views of semiconductor devices incorporating the faceted III-N heterostructures illustrated in FIG. 4A-4D, in accordance with embodiments.
Figure 5B:
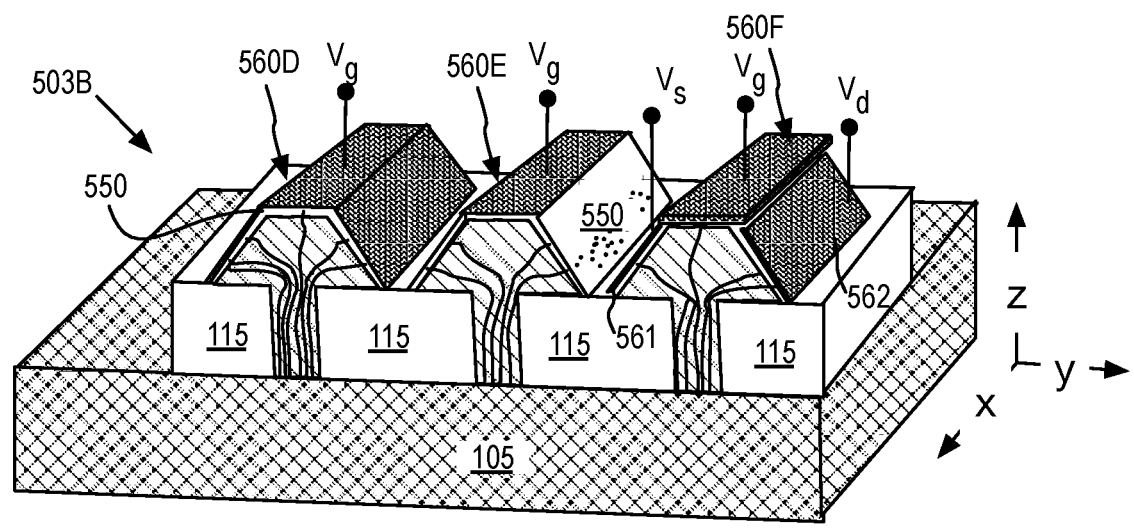

FIGS. 5A and 5B illustrate two exemplary non-planar semiconductor devices 503A, and 503B that further leverage the geometry of the elevated III-N semiconductor structures 403A (FIG. 4A), and 403B (FIG. 4B), respectively. Referring to FIG. 5A, semiconductor device 503A includes a gate stack 560A disposed over a semiconductor device layer 550. Gate stack 560A is disposed over the pair of intersecting inclined sidewall facets, forming a bi-gate transistor. In an exemplary embodiment, semiconductor device layer 550 includes a III-N polarization layer, such as AlGaN. Since the inclined sidewall facets are semi-polar, the polarization layer creates a two dimensional electron gas (2DEG) within a channel layer (e.g., GaN) along each of the sloped sidewalls. Gate stack 560A includes at least a gate electrode and may further include and gate dielectric. The gate electrode may be any metal or semiconductor known to have suitable conductivity and work function difference from a channel semiconductor layer disposed below the III-N polarization layer. The gate dielectric, if present, may be any high-k or conventional dielectric material known to be suitable for III-N FETs. The channel semiconductor may be GaN or any other III-N material having a piezoelectric and spontaneous polarization strength distinct from the III-N polarization material such that, under certain circumstances, the 2DEG formed along the inclined sidewalls is controllable by a bias voltage applied to gate stack 560A.

In one exemplary embodiment where substrate 105 is (100) silicon, and trench material 115 extends in the <110> direction over substrate 105, semiconductor device 503A is a bi-gate HFET with a source terminal 561 and a drain terminal 562 disposed on opposite sides of gate stack 560A so that the current carrying direction is in the <110> direction of substrate 105 (x-axis in FIG. 5A). In further embodiments, semiconductor device 503A is adjacent to a second region over substrate 105 where a silicon MOSFET also has terminals arranged for a <110> current carrying direction. For example, in the SoC 101 illustrated in FIG. 1A, semiconductor device 503A may be disposed over substrate surface region 103 with HFETs 160 having the terminals 560A, 561, and 562 substantially as illustrated in FIG. 5A.

Emphasizing semiconductor device 503A may be one or more of a wide variety of devices that utilize the raised semiconductor structures described herein, FIG. 5A further illustrates an LED terminal 560B and an optical modulator terminal 560C disposed over elevated III-N semiconductor structures in a manner similar to that described for gate stack 560A.

FIG. 5B illustrates another exemplary semiconductor device 503B including one or more HFET structure that includes a gate stack disposed over a device layer, such as a polarization layer and/or channel layer. Three different gate stack embodiments are illustrated. Gate stack 560D is a tri-gate, disposed over a device layer on the c-plane as well as the inclined facets. Because the c-plane is polar, a 2DEG with higher charge density is formed in a GaN channel layer disposed on the c-plane. Because the inclined facets are semi-polar, a 2DEG with lower charge density is formed in a GaN channel layer disposed on these facets. As such, gate stack 560D forms a multi-conductivity device. Source and drain terminals may be disposed on either side of the gate stack 560D, for example as was described above in the context of gate stack 560A.

FIG. 5B further illustrates a gate stack 560E, which is disposed only over the c-plane surface of a raised III-N semiconductor structure where semiconductor defect density is lowest. Source and drain terminals may be disposed on either side of the gate stack 560D, for example as was described above in the context of gate stack 560A. In an alternate embodiment, a source terminal 561 and drain terminal 562 may be disposed over the inclined sidewall facets, and surrounding gate stack 560F as further illustrated in FIG. 5B.

Figure 5C:
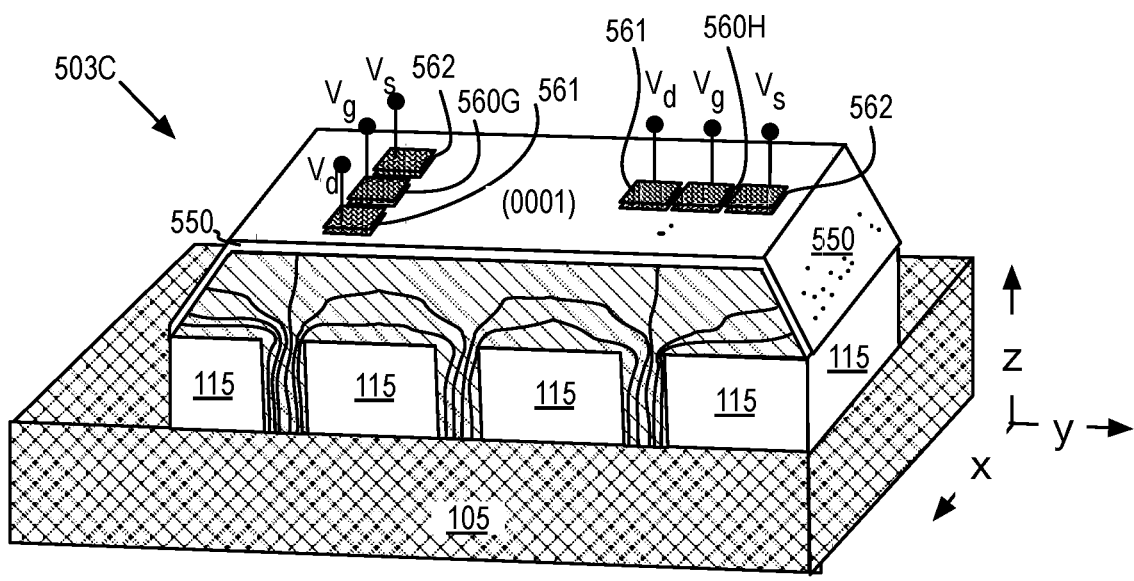
Figure 5D:
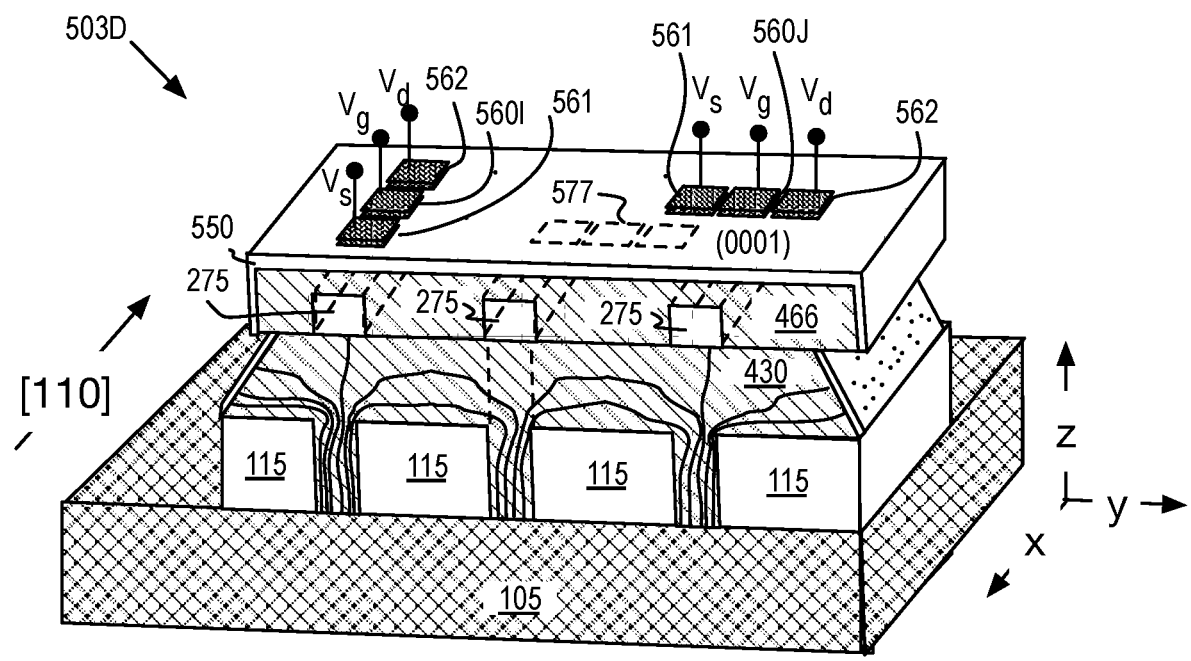

FIGS. 5C and 5D illustrate two exemplary planar semiconductor devices 503C and 503D that utilize the low-defect density c-plane of the elevated III-N semiconductor structures 403C (FIG. 4D), and 403D (FIG. 4D), respectively. In FIG. 5C, semiconductor device 503C includes gate stack 560G disposed over semiconductor device layer 550. Gate stack 560G is disposed over a device layer on the c-plane, forming a planar gate transistor. In an exemplary embodiment, semiconductor device layer 550 includes a III-N polarization layer, such as AlGaN. Gate stack 560G includes at least a gate electrode and may further include and gate dielectric. The gate electrode may be any metal or semiconductor known to have suitable conductivity and work function difference from a channel semiconductor layer disposed below the III-N polarization layer. The gate dielectric, if present, may be any high-k or conventional dielectric material known to be suitable for III-N FETs. The channel semiconductor may be GaN or any other III-N material having a piezoelectric and spontaneous polarization strength distinct from the III-N polarization material such that, under certain circumstances, a two dimensional electron gas (2DEG) is formed in a manner which is controllable by a bias voltage applied to gate stack 560G.

In one exemplary embodiment where substrate 105 is (100) silicon, and trench material 115 extends in the <110> direction over substrate 105, semiconductor device 503C is an HFET with a source terminal 561 and a drain terminal 562 disposed on opposite sides of gate stack 560G with the current carrying direction for HFET in the <110> direction (x-axis in FIG. 5C). In further embodiments, semiconductor device 503C is adjacent to a second region over substrate 105 where a silicon MOSFET also has terminals also arranged for a <110> current carrying direction. For example, in the SoC 101 illustrated in FIG. 1A, semiconductor device 503C may be disposed over substrate surface region 103 with HFETs 160 having the terminals 560A, 561, and 562 substantially as illustrated in FIG. 5C. In another embodiment illustrated in FIG. 5C, source terminal 561 and drain terminal 562 are disposed on opposite sides of gate stack 560H so that the HFET current carrying direction aligned with the <–110> direction of substrate 105 (y-axis in FIG. 5C).

FIG. 5D illustrates exemplary planar transistors disposed over a device layer 550 on the stacked III-N semiconductor heterostructure 430D (FIG. 4D). Semiconductor device 503D includes gate stack 560I disposed over semiconductor device layer 550. Gate stack 560I is disposed over a device layer on the c-plane, forming a planar gate transistor. In an exemplary embodiment, semiconductor device layer 550 includes a III-N polarization layer, such as AlGaN. Gate stack 560I includes at least a gate electrode and may further include and gate dielectric. The gate electrode may be any metal or semiconductor known to have suitable conductivity and work function difference from a channel semiconductor layer disposed below the III-N polarization layer. The gate dielectric, if present, may be any high-k or conventional dielectric material known to be suitable for III-N FETs. The channel semiconductor may be GaN or any other III-N material having a piezoelectric and spontaneous polarization strength distinct from the III-N polarization material such that, under certain circumstances, a two dimensional electron gas (2DEG) is formed in a manner which is controllable by a bias voltage applied to gate stack 560I.

In one exemplary embodiment where substrate 105 is (100) silicon, and trench material 115 extends in the <110> direction over substrate 105, semiconductor device 503D is an HFET with a source terminal 561 and a drain terminal 562 disposed on opposite sides of gate stack 560I with the current carrying direction for HFET in the <110> direction (x-axis in FIG. 5D). In further embodiments, semiconductor device 503D is adjacent to a second region over substrate 105 where a silicon MOSFET also has terminals arranged for a <110> current carrying direction. For example, in the SoC 101 illustrated in FIG. 1A, semiconductor device 503D may be disposed over substrate surface region 103 with HFETs 160 having the terminals 560I, 561, and 562 substantially as illustrated in FIG. 5D. In an alternative embodiment also illustrated in FIG. 5D, source terminal 561 and drain terminal 562 are disposed on opposite sides of gate stack 560J so that the HFET current carrying direction is aligned with the <–110> direction of substrate 105. The devices can also be formed on top of the device layer area disposed/located between the oxide structures 275, as illustrated by dashed lined electrodes 577, because these regions will be advantageously free of merging regions of the overgrow (GaN) cap.

The semiconductor heterostructures and semiconductor devices described above may be fabricated using a variety of methods. Lateral epitaxial overgrowth central to the fabrication of the raised III-N semiconductor structures may be performed with a variety of growth techniques and epitaxially growth chamber configurations. In embodiments, lateral epitaxial overgrowth conditions are engineered to favor the inclined sidewall facets described above. Notably, the ease with which inclined sidewall facets can be formed may depend in part on the substrate semiconductor surface from which the overgrowth is seeded. For example, it is more challenging to form inclined sidewall facets from a substrate semiconductor surface with cubic crystallinity (e.g., 3C—SiC, or silicon) than from a substrate semiconductor surface with hexagonal/wurtzite crystallinity (e.g., 4H—SiC). In some embodiments, to facilitate lateral III-N overgrowth favoring inclined sidewall facets from a silicon cubic substrate, the III-N epitaxial material is seeded from a <111> surface. However, for those embodiments advantageously more compatible with CMOS, inclined sidewall facets are favored during lateral overgrowth of III-N epitaxial material seeded from a (100) silicon substrate primarily through control of the lateral epitaxial growth conditions.

FIG. 7 is a trend matrix illustrating effects of lateral GaN growth conditions on crystal faceting during a lateral growth phase of GaN material seeded from a (100) silicon surface, in accordance with embodiments. Although experimentally studied for GaN with a c-axis normal to a (100) silicon surface, the inventors currently understand the effects illustrated FIG. 7 to be applicable to other materials in the III-N system, and may be further applicable to other substrate crystal orientations, as well as other wurtzite epitaxial materials.

In further reference to FIG. 7, the inventors have found growth pressure to be a significant parameter that can be controlled to favor the inclined sidewall facets described above. Generally, lower growth pressure growth has been found to favor the growth of non-inclined sidewall planes, while higher growth pressure favors the inclined semi-polar planes. Although not bound by theory, inventors currently understand this effect of pressure to be related to dangling bond (DB) density within the epitaxial material. The greater levels of active nitrogen available a high pressures may enable the inclined planes of higher DB density. In exemplary GaN embodiments, the lateral epitaxial overgrowth pressure is in the range of 30-350 Torr. The inventors have also found growth temperature to be a significant parameter that can be controlled to favor the inclined sidewall facets described above. Generally, a higher growth temperature has been found to favor the growth of non-inclined sidewall planes whereas a lower growth temperature favors the inclined planes. In exemplary GaN embodiments, the lateral epitaxial overgrowth temperature is in the range of 950-1150° C. The inventors have also found growth V/III precursor ratio to be a significant parameter that can be controlled to favor the inclined sidewall facets described above. Generally, a lower V/III favors non-inclined planes whereas higher V/III ratio favors the formation of inclined planes. In exemplary GaN embodiments where the group V precursor is $NH_3$ and the group III precursor is tri-methyl-gallium (TMG), the V/III ratio is in the range of 100-5000. Following this guidance, one of ordinary skill may determine a suitable LEO process space that may be further utilized in any of the below methods to fabricate the various exemplary structures and devices provided elsewhere herein.

Figure 8A:
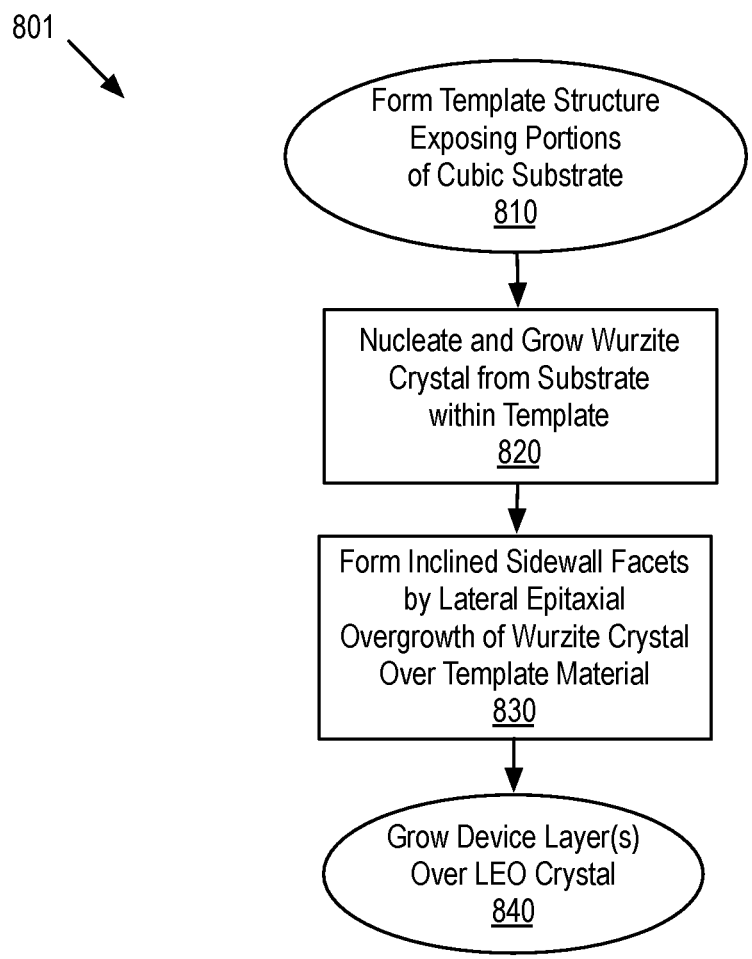
FIG. 8A is a flow diagram illustrating a method of forming a semiconductor heterostructure having inclined sidewall facets, in accordance with embodiments.

FIG. 8A is a flow diagram illustrating a method 801 of forming a semiconductor heterostructure having inclined sidewall facets, in accordance with embodiments. Method 801 may be utilized to form any of the semiconductor heterostructures described herein (e.g., FIG. 4A-4D). Method 801 begins with forming a template structure on the substrate semiconductor surface at operation 810. While any template structure known to be suitable for heteroepitaxial wurtzite crystal growth may be employed, in exemplary embodiments with a cubic semiconductor surface, the template includes trenches extending in a <110> direction of the substrate. The template structures exposes stripes of a (100) semiconductor surface. At operation 820, the wurtzite material is nucleated and grown from the exposed semiconductor substrate surface to backfill the template structure (e.g., backfill the trench stripes). The wurtzite material grows at operation 820 until reaching the vertical height of the template sidewalls. Operation 820 may rely on first epitaxial growth conditions (e.g., a first III-N growth pressure, a first III-N growth temperature, and a first V/III growth precursor ratio). Operation 820 may be terminated when the template structure is substantially backfilled.

Method 801 proceeds to LEO operation 830, where the wurtzite material is laterally overgrown over the template material in a manner that favors formation of inclined sidewall facets. To promote inclined facets, epitaxial growth conditions may be changed from those employed at operation 820 (e.g., a second III-N growth pressure, a second III-N growth temperature, and a second V/III growth precursor ratio), for example based on a trend matrix such as that depicted for GaN in FIG. 7.

Method 801 then completes at operation 840 with the formation of one or more semiconductor device layers over the raised structure formed at operation 830. Operation 840 may entail, for example, epitaxial growth of a channel layer, and/or a polarization layer, and/or a quantum well stack, etc. Any epitaxial process known to be suitable for forming the desired device layer may be employed at operation 840. Device termination and interconnection may then proceed in any conventional manner to complete a semiconductor device (e.g., any of those described herein in the context of FIG. 5A-5D).

Figure 8B:
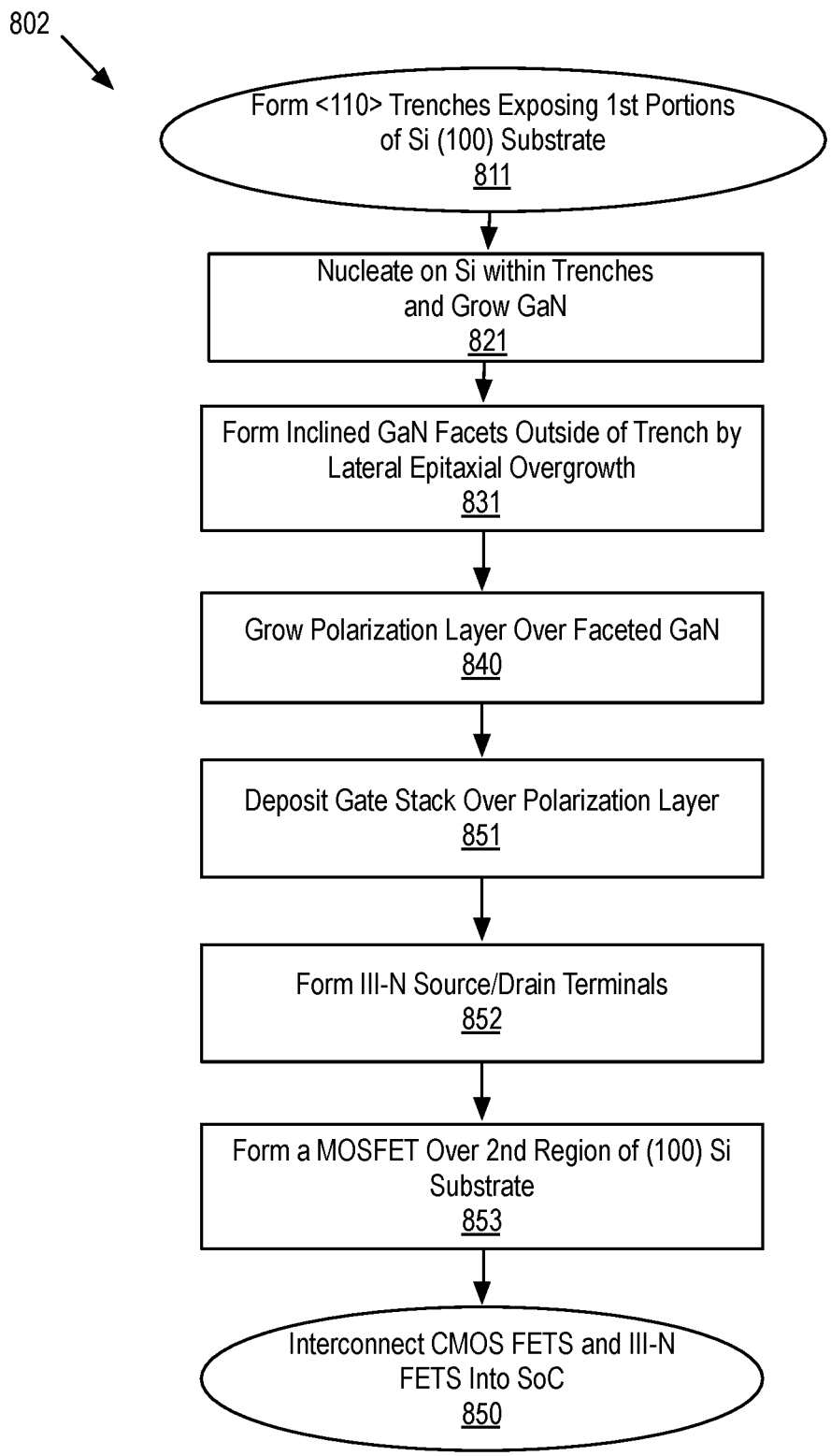
FIG. 8B is a flow diagram illustrating a method of forming a SoC including silicon-based MOSFETs and GaN-based HFETs on a heteroepitaxial GaN structure having inclined sidewall facets, in accordance with embodiments.
Figure 9A:
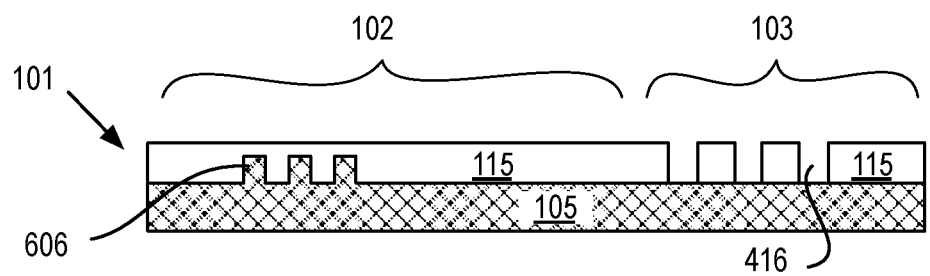
FIGS. 9A, 9B, 9C, 9D, 9E, 9F, and 9G are cross-sectional views of an SoC evolving as selected operations in the method illustrated in FIG. 8B are performed, in accordance with embodiments.
Figure 9B:
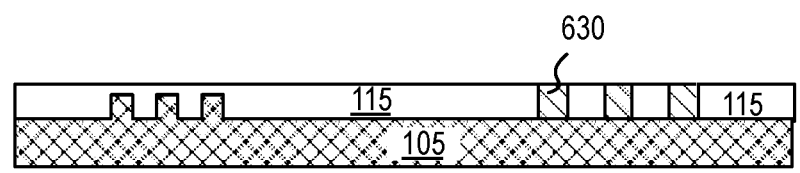
Figure 9C:
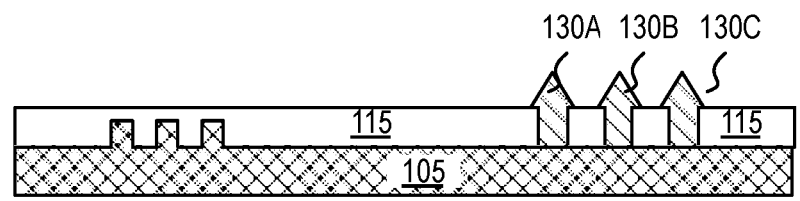
Figure 9D:
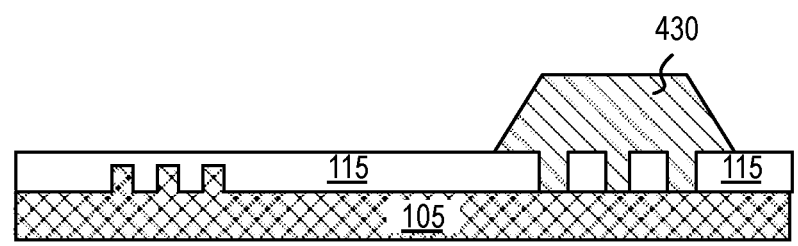
Figure 9E:
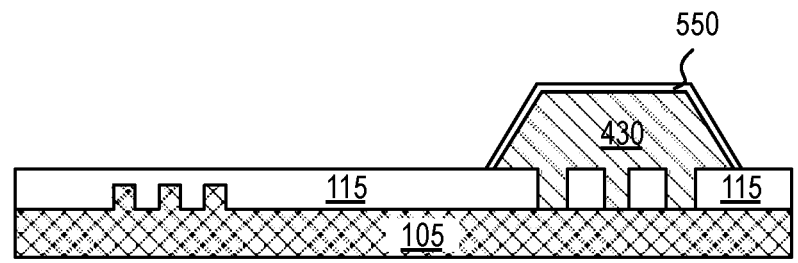
Figure 9F:
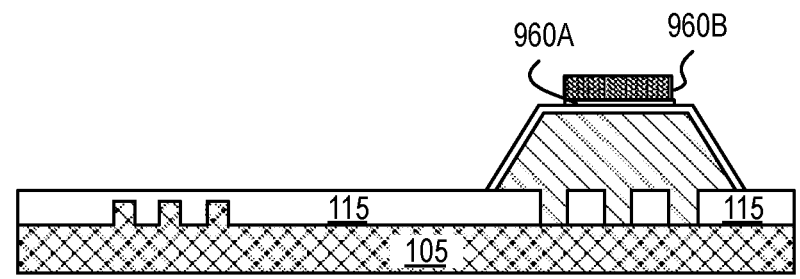
Figure 9G:
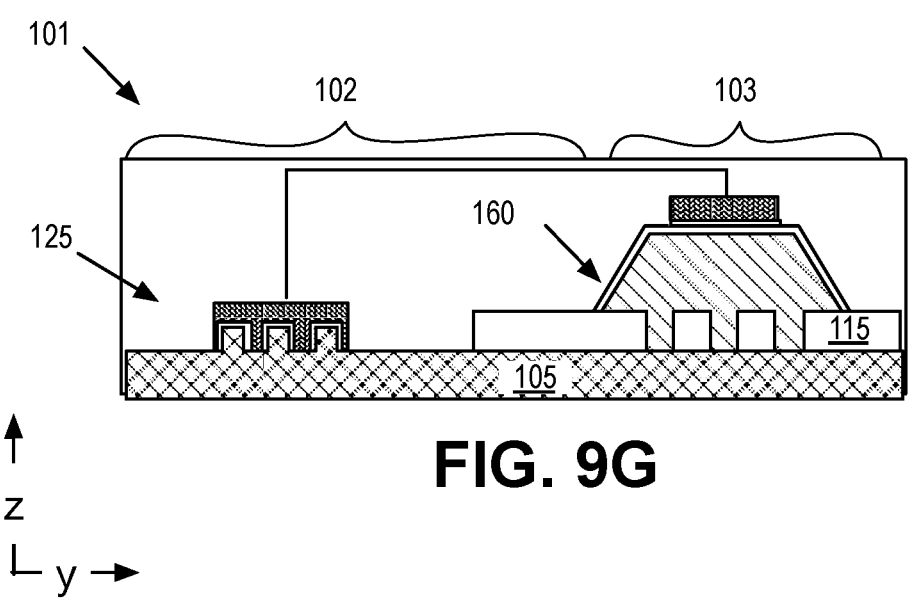

FIG. 8B is a flow diagram illustrating a method 802 of forming a SoC including MOSFETs on silicon and GaN HFETs on a heteroepitaxial GaN structure having inclined sidewall facets, in accordance with embodiments. Method 802 is one exemplary embodiment of method 801. FIG. 9A-9G are cross-sectional views of an SoC evolving as selected operations in the method illustrated in FIG. 8B are performed, in accordance with embodiments.

Referring to FIG. 8B, method 802 begins with forming <110> oriented trench stripes over a (100) silicon surface. In the exemplary embodiment further illustrated in FIG. 9A for SoC 101, trench material 115, is formed over fin structures 906 within first substrate surface region 102, and further patterned into trenches 416 within second substrate surface region 103.

Returning to FIG. 8B, at operation 821 a nucleation layer is formed over the (100) silicon substrate surface and GaN is grown within the trenches using first epitaxial growth conditions. A thin nucleation layer (e.g., 10-50 nm thick) may be epitaxially deposited for example by chemical vapor deposition (CVD), vapor phase deposition (PVD/sputtering), or molecular beam epitaxy (MBE). This layer is advantageously selective to the exposed semiconductor surface and does not form on the trench material (e.g., dielectric/oxide). In some embodiments however, the nucleation layer is not selective and an amorphous material is formed on the non-semiconductor trench material. Material grows at operation 821 until reaching the vertical height of the template sidewalls. Operation 821 may rely on first epitaxial growth conditions (e.g., a first GaN growth pressure, a first GaN growth temperature, and a first V/III growth precursor ratio). Operation 821 may be terminated when the trenches are substantially filled. In the exemplary embodiment further illustrated in FIG. 9B, upon termination of operation 821, III-N semiconductor structure 630 is substantially planar with trench material 115.

Returning to FIG. 8B, at operation 831, inclined GaN Facets are formed outside of the template trench by a GaN LEO process favoring the inclined facets. For the exemplary embodiments, at least one of the first GaN growth pressure, the first GaN growth temperature, and the first N/Ga growth precursor ratio employed at operation 821 is changed to at least one of a second (higher) GaN growth pressure, a second (lower) GaN growth temperature, or a second (higher) N/Ga growth precursor ratio. In one exemplary embodiment, a first GaN growth pressure employed at operation 821 is increased at operation 831 to a second GaN growth pressure that is in the range of 30-350 Torr; a first GaN growth temperature employed at operation 821 is decreased at operation 831 to a second GaN growth temperature in the range of 950-1150° C.; and a first N/Ga growth precursor ratio employed at operation 821 is increased at operation 831 to a second N/Ga growth precursor ratio in the range of 100-5000 NH3/TMG. In embodiments, the epitaxial growth process employed at operation 831 has a lateral growth rate:vertical growth rate of at least 1.5:1 and advantageously 2:1, or more. Defects are propagated away from the wurtzite crystal c-axis during operation 831. At operation 831 the GaN film is advantageously grown over the trench material surface by no more than 1 m. As further illustrated in FIGS. 9C and 9D, raised semiconductor structures 130A, 130B, and 130C having peaked profiles are formed during an initial portion of operation 831. With additional LEO duration the peaks expand into trapezoidal profiles, which continue expand into an arbitrarily large merged raised structure 430 of trapezoidal profile and a z-height less than 750 nm, for example.

Returning to FIG. 8B, method 802 continues at operation 840 where a semiconductor device layer including a III-N polarization layer is grown over the raised GaN semiconductor structure formed by the GaN LEO operation 831. Any conventional epitaxial process may be employed to form the III-N polarization layer. As further illustrated in FIG. 9E, a polarization layer 550 includes a III-N polarization layer that will form a 2DEG at the interface with the raised structure 430. Referring again to FIG. 8B, a gate stack is deposited over the III-N polarization layer. In the exemplary embodiment further illustrated in FIG. 9F, formation of the gate stack further entails deposition of a gate dielectric 960A and deposition of a gate electrode 960B. Any known dielectric deposition process, such as CVD and atomic layer deposition (ALD) may be utilized to form gate dielectric 960A. Any known metal deposition process, such as CVD, ALD, and/or PVD may be utilized to form gate electrode 960B.

Method 802 (FIG. 8B) continues with operation 852 wherein III-N source/drain terminals are formed by epitaxially growing a source/drain semiconductor using any known technique. For example, a raised source/drain semiconductor may be grown subsequent to depositing a gate dielectric and gate electrode over a III-N polarization layer. Alternatively, source/drain semiconductor may be grown prior to depositing a gate dielectric and gate electrode over a III-N polarization layer. At operation 853, a silicon-based MOSFET is formed over the substrate at operation 853. Any known MOSFET fabrication process may be enlisted at operation 853. In the exemplary embodiment further illustrated in FIG. 9G, a non-planar MOSFET 125 (e.g., finFET) is formed using any known technique. In alternate embodiments, a planar MOSFET may be formed. Method 802 (FIG. 8B) completes at operation 850 with interconnection of silicon-based MOSFET 125 with III-N-based HFET 160 using any known backend metallization process.

Figure 10:
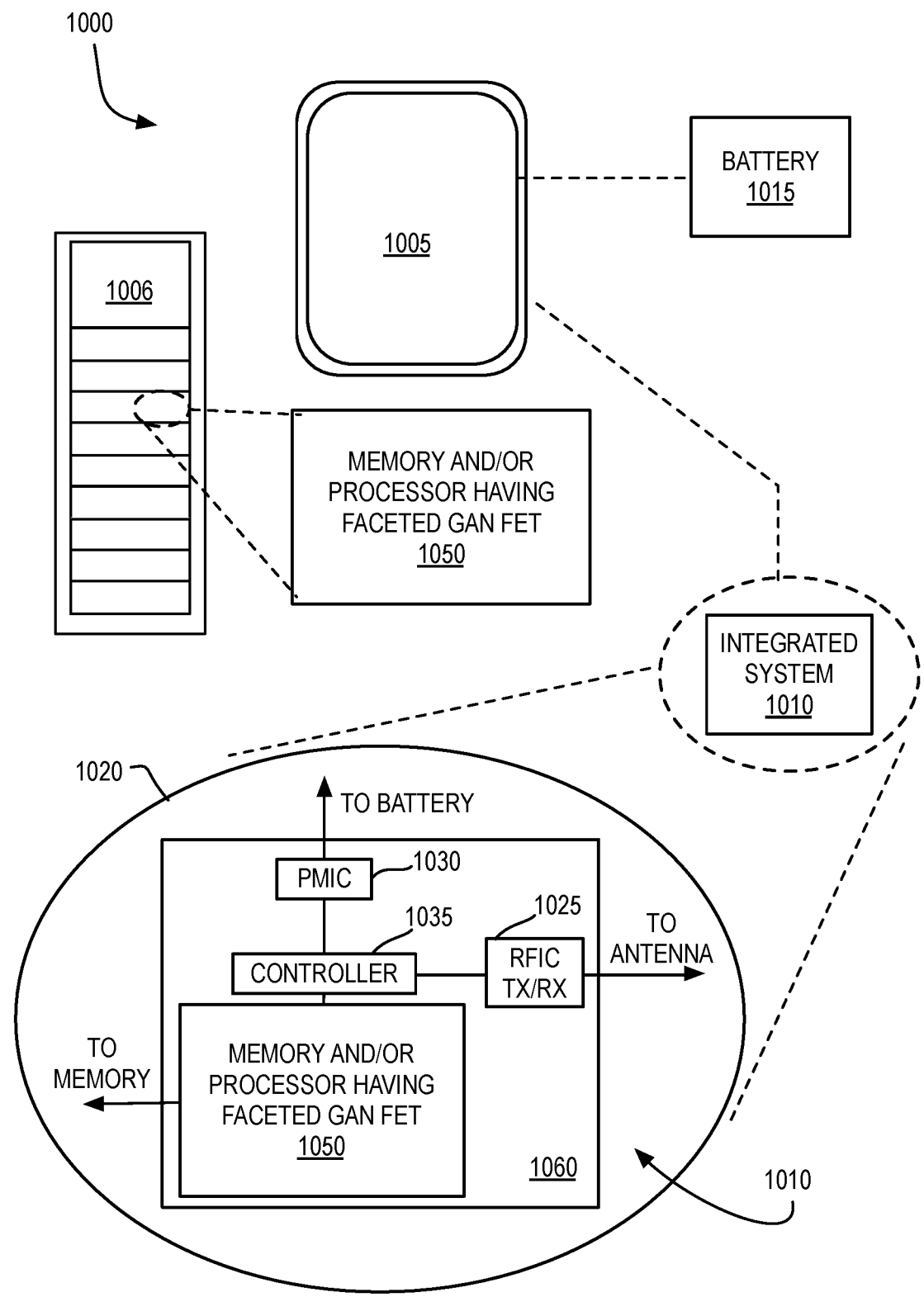
FIG. 10 illustrates a mobile computing platform and a data server machine employing an SoC including silicon FETs on silicon and GaN HFETs on a heteroepitaxial GaN structure having inclined sidewall facets, in accordance with embodiments of the present invention.

FIG. 10 illustrates a system 1000 in which a mobile computing platform 1005 and/or a data server machine 1006 employs an IC including at least one III-N HFET employing a raised III-N semiconductor with inclined sidewall facets, in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) including at least one III-N HFET disposed on a raised III-N semiconductor with inclined sidewall facets, for example as describe elsewhere herein. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 11:
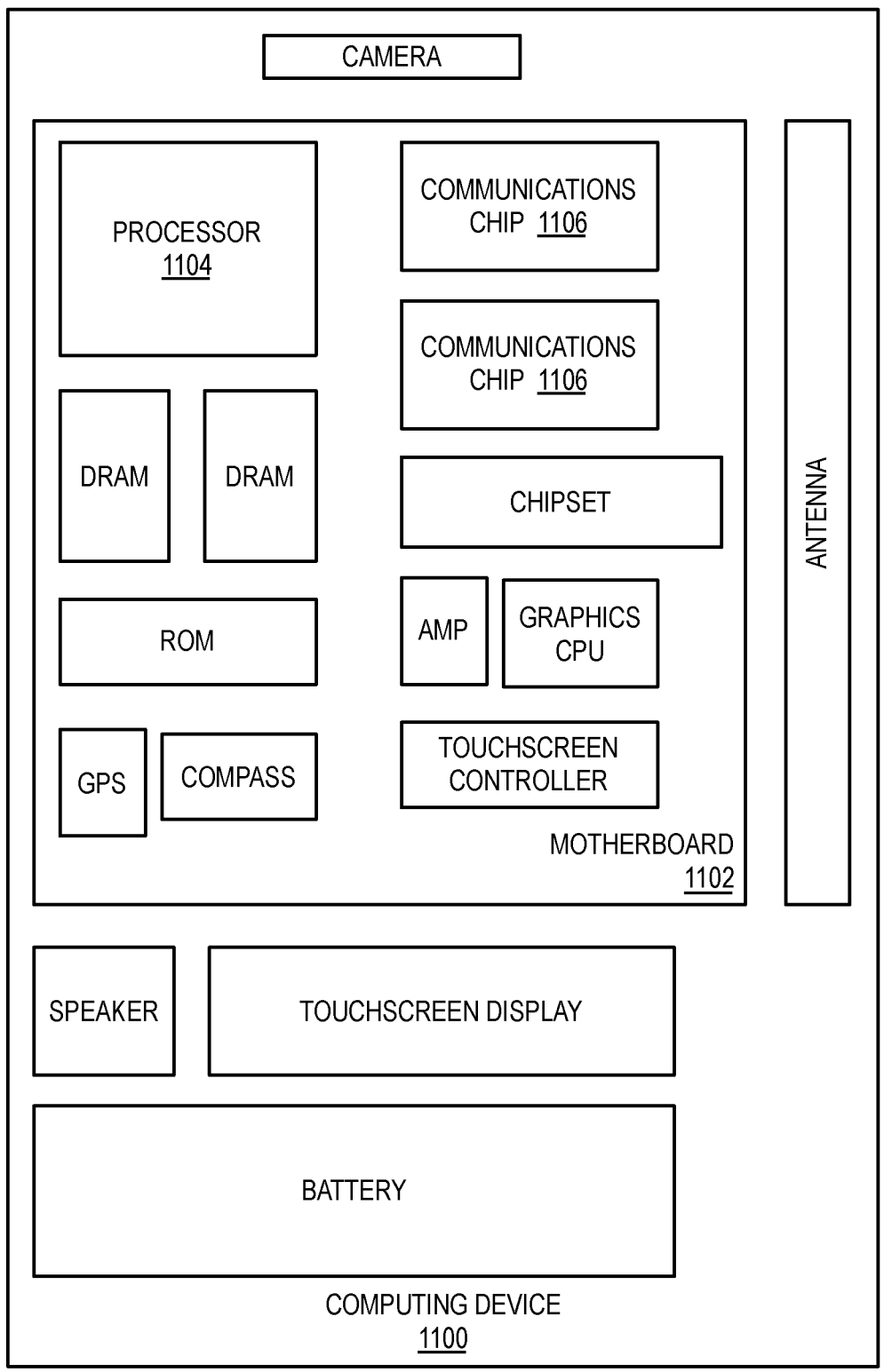
FIG. 11 is a functional block diagram of an electronic computing device, in accordance with an embodiment of the present invention.

FIG. 11 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate at least one III-N HFET disposed on a raised III-N semiconductor with inclined sidewall facets, in accordance with embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

One or more first embodiments, a semiconductor heterostructure includes a substrate semiconductor having cubic crystallinity. The heterostructure further includes an elevated semiconductor structure having wurtzite crystallinity disposed in one or more trench in a trench material layer and intersecting a surface of the substrate semiconductor. The elevated semiconductor structure further has a pair of inclined sidewall facets sloping from a top surface of the elevated semiconductor structure to an interface with the trench material disposed laterally beyond a sidewall of the trench.

In furtherance of the first embodiments, the elevated semiconductor structure comprises a III-N semiconductor with the c-axis nearly orthogonal to the substrate semiconductor surface. The inclined sidewall facets are semi-polar planes that are non-parallel and non-normal to the c-axis.

In furtherance of the first embodiments, the elevated semiconductor structure comprises a III-N semiconductor with the c-plane no more than 10° from parallel to a (100) plane of the substrate. The inclined sidewall facets are semi-polar planes intersecting the c-plane at angles of 50-80 degrees.

In furtherance of the embodiment immediately above, at least one of the inclined sidewall facets is a semi-polar plane selected from the group consisting of {1-101}, {1122}, and {2021}.

In furtherance of the first embodiments, the one or more trench further comprises a first trench and a second trench, and the elevated semiconductor structure has a top surface substantially parallel with the c-plane and extending between the first and second trench.

In furtherance of the embodiment immediately above, a plurality of threading dislocations extends from the exposed surface of the substrate semiconductor, through a z-height of the trench and bending toward one of the pair of inclined sidewall facets.

In furtherance of the embodiment immediately above, the plurality of threading dislocations further comprises a first threading dislocation disposed proximal a sidewall of the trench and a second threading dislocation disposed proximate a centerline of the trench, and the first threading dislocation bends toward one of the inclined sidewall facets at a first z-height relative to the substrate semiconductor that is smaller than a second z-height at which the second threading dislocation bends toward one of the inclined sidewall facets.

In furtherance of the embodiment immediately above, at least one of the pair of inclined sidewall facets has a defect density that is at least an order of magnitude greater than the top surface of the elevated semiconductor.

In furtherance of the first embodiments, the one or more trench further comprises a first trench and a second trench, and the elevated semiconductor structure further comprises a first elevated structure disposed in the first trench with the c-plane no more than 10° from parallel to a (100) plane of the substrate and having a first pair of inclined sidewall facets intersecting the c-plane at angles of 50-80 degrees. The elevated semiconductor structure further comprises a second elevated structure disposed in the second trench with the c-plane no more than 10° from parallel to a (100) plane of the substrate and having a second pair of inclined sidewall facets intersecting the c-plane at angles of 50-80 degrees.

In furtherance of the embodiment immediately above, the first pair of inclined sidewall facets intersect each other, and the second pair of inclined sidewall facets intersect each other; or the first pair of inclined sidewall facets is separated by a first top surface substantially parallel with the c-plane and the second pair of inclined sidewall facets is separated by a second top surface substantially parallel with the c-plane.

In furtherance of the embodiment immediately above, the raised semiconductor structure has a z-height above a top surface of the trench material that is at least $$\frac{\sqrt{3}}{2}$$

times a lateral width of the trench.

In furtherance of the embodiment above, the raised semiconductor structure has a z-height above a top surface of the trench material that is less than $$\frac{\sqrt{3}}{2}$$

times a lateral width of the trench summed with a third of the pitch of two adjacent trenches.

In furtherance of the first embodiments, the semiconductor heterostructure further includes a pair of second trenches exposing a surface of the elevated semiconductor structure and with each of the second trenches laterally aligned between a pair of trenches in the underlying trench material layer. The semiconductor heterostructure further includes a semiconductor cap having wurtzite crystallinity disposed within the pair of second trenches and extending laterally over sidewalls of the pair of second trenches.

In furtherance of the first embodiments, the substrate semiconductor surface comprises (100) silicon. The trench extends over the substrate in the <110> direction, and has a lateral width no more than 500 nm. The inclined sidewall facets are semi-polar planes intersecting the c-plane at angles of 50-80 degrees. The elevated semiconductor has a z-height over a top surface of the trench layer that is less than 750 nm.

In one or more second embodiments, a semiconductor device includes a semiconductor heterostructure that further includes a substrate semiconductor having cubic crystallinity. The semiconductor heterostructure further includes an elevated semiconductor structure having wurtzite crystallinity disposed in one or more trench in a trench material layer intersecting a surface of the substrate semiconductor, and with a pair of inclined sidewall facets sloping from a top surface of the elevated semiconductor structure to an interface with trench material disposed laterally beyond a sidewall of a trench. The semiconductor heterostructure further includes one or more semiconductor device layer disposed over at least one of the inclined sidewall facets or a top surface of the elevated semiconductor structure separating the inclined sidewall facets. The semiconductor device further includes one or more device terminal coupled to the one or more semiconductor device layers.

In furtherance of the first embodiments, the elevated semiconductor structure comprises a III-N semiconductor with the c-plane no more than 10° from parallel to a (100) plane of the substrate. The inclined sidewall facets are semi-polar planes that are non-parallel and non-normal to the c-plane. The one or more device terminal is disposed over at least one of the inclined sidewall facets or disposed over a top surface parallel to the c-plane extending between the inclined sidewall facets.

In furtherance of the embodiment immediately above, the elevated structure further comprises III-N semiconductor. The semiconductor device layer comprises a III-N polarization layer having a different composition than the elevated structure. A gate stack comprising a first of the one or more device terminals is disposed over the III-N polarization layer and a channel region of the elevated structure. A source terminal and a drain terminal are disposed on opposite sides of the gate stack.

In furtherance of the embodiment immediately above, the substrate semiconductor surface comprises (100) silicon. The trench extends in the <110> direction of the substrate semiconductor surface. The elevated semiconductor has the c-plane parallel to the substrate semiconductor surface. THE Inclined sidewall facets are semi-polar planes intersecting the c-plane at angles of 50-80 degrees. The substrate, the gate stack, the source terminal, and the drain terminal are each disposed over the top surface of the raised semiconductor structure parallel to the c-plane and extending between the inclined sidewall facets.

In furtherance of the embodiment immediately above, the gate stack is further disposed over the pair of inclined sidewall facets.

In furtherance of the embodiment above, the semiconductor device further includes a MOSFET disposed over the substrate surface adjacent to the elevated semiconductor.

In one or more third embodiments, a method of forming a semiconductor heterostructure includes epitaxially growing a raised semiconductor structure with wurtzite crystallinity from a substrate surface having cubic crystallinity exposed within a trench in a trench material layer disposed over the substrate. The method includes bending threading dislocations from the c-axis to the c-plane by inclining the sidewalls of the raised semiconductor structure during a lateral epitaxial overgrowth (LEO) process. The method includes growing one or more device layer over the raised semiconductor structure.

In furtherance of the third embodiments, the LEO process further comprises laterally growing the raised semiconductor structure at a rate that is at least twice the c-axis growth rate and favors the wurtzite crystal facets non-parallel and non-normal to the c-plane.

In furtherance of the third embodiments, the method further comprises forming the trench in the trench material layer by etching into a dielectric layer a pair of trenches exposing the substrate surface. Epitaxially growing the raised semiconductor structure within the trench further comprises epitaxially growing a III-N semiconductor within each of the pair of trenches. The LEO process further comprises laterally growing a raised III-N peak over each of the pair of trenches, each raised III-N peak having intersecting inclined sidewall facets that extend over a portion of the trench layer. The LEO process further comprises laterally growing the raised III-N peaks into one raised semiconductor structure having a top surface parallel to the c-plane and extending between two inclined sidewall facets. The method further comprises depositing a device terminal over the top surface of the raised semiconductor structure parallel to the c-plane.

In furtherance of the embodiment immediately above, epitaxially growing the raised semiconductor structure within the trench further comprises epitaxially growing a III-N semiconductor at a first growth temperature, a first growth pressure, and a first V/III ratio. Performing the LEO further comprises epitaxially growing the III-N semiconductor with at least one of a second growth temperature lower than the first growth temperature; a second growth pressure higher than the first growth pressure; or a second V/III ratio greater than the first V/III ratio.

In furtherance of the embodiment immediately above, performing the LEO further comprises epitaxially growing the III-N semiconductor with the second growth temperature no greater than 1150C; the second pressure no greater than 350 Torr; and with the second V/III ratio at least 100.

In furtherance of the third embodiments, the method further includes forming the trench in the material layer by etching into a dielectric layer a trench having a longest length in a <110> direction over a (100) silicon surface. Epitaxially growing the raised semiconductor structure within the trench further comprises epitaxially growing a III-N semiconductor. Growing the one or more device layer further comprises growing a III-N polarization layer over the inclined sidewall facets. The method further comprises depositing a gate stack over the polarization layer, and forming a source terminal and a drain terminal on opposite sides of the gate stack, and aligned with the <110> direction.

In furtherance of the embodiment immediately above, depositing the gate stack over the polarization layer further comprises depositing the gate stack over the inclined sidewall facets.

In furtherance of the embodiment above, the method further includes forming a MOSFET over the (100) silicon surface, wherein forming the MOSFET further includes forming a second gate stack over the (100) silicon surface adjacent to the raised semiconductor structure, and forming a second source terminal and second drain terminal aligned with the second gate stack along the <110> direction.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A device structure, comprising:
    a substrate comprising a crystalline Group IV material;
    a dielectric material over the substrate;
    a body comprising one or more Group III-N materials having hexagonal crystallinity, wherein the body comprises a first portion in contact with a (100) crystal plane of the Group IV material, and adjacent to a sidewall of the dielectric material that extends laterally in a <110> direction over the (100) crystal plane, and wherein the body comprises a second portion separated from the crystal plane by the first portion, wherein the second portion has a thickness over the first portion and over a top surface of the dielectric material a lateral distance beyond the sidewall of the dielectric material, wherein a c-plane of the Group III-N materials is substantially parallel to the (100) crystal plane of the Group IV material, and
    one or more terminals over the second portion of the body and substantially parallel to the c-plane, wherein the thickness of the second portion comprises an upper portion over a lower portion, the upper portion with lower defect density than the lower portion.

2. The device structure of claim 1, wherein the terminals comprise a gate electrode.

3. The device structure of claim 2, wherein the terminals further comprise a source terminal and a drain terminal on opposite sides of the gate electrode.

4. The device structure of claim 1, wherein the c-plane is no more than 10° from parallel to the (100) crystal plane of the Group IV material, and the second portion comprises an inclined sidewall having a slope of 50-80 degrees relative to the top surface of the dielectric material.

5. The device structure of claim 4, wherein a top surface of the second portion of the body has a lower defect density than the inclined sidewall.

6. The device structure of claim 1, wherein the terminals comprise a first electrode of a diode.

7. The device structure of claim 1, further comprising a MOSFET over a portion of the substrate adjacent to the body, wherein the MOSFET includes a source and a drain with a gate electrode therebetween, wherein the source and the drain are coupled through a channel length of the Group IV material.

8. The device structure of claim 1, wherein the first portion of the body is one of a plurality of first portions, each first portion separated from adjacent ones of the plurality by the dielectric material with the second portion over each of the plurality of first portions, and over the dielectric material between the first portions.

9. The device structure of claim 1, wherein the thickness is at least $$\frac{\sqrt{3}}{2}$$

times a lateral width of the first portion.

10. The semiconductor heterostructure of claim 1, wherein:
the Group IV material is silicon; and
the Group III-N materials comprise at least GaN.

11. A device structure, comprising:
a substrate comprising a crystalline Group IV material;
a dielectric material over the substrate;
a body comprising one or more Group III-N materials having hexagonal crystallinity, wherein a c-plane of the body is substantially parallel to a (100) crystal plane of the Group IV material, wherein the body comprises a plurality of first portions between the (100) crystal plane of the Group IV material and a second portion of the body, wherein individual ones of the plurality first portions have a sidewall adjacent to the dielectric material, and are separated from each other by the dielectric material, and wherein the second portion is over a top surface of the dielectric material, and wherein the body comprises a plurality of third portions between the second portion of the body and a fourth portion of the body, wherein individual ones of the plurality of third portions have a sidewall adjacent to a second dielectric material, and are separated from each other by the second dielectric material, and wherein the fourth portion is over a top surface of the second dielectric material; and
one or more terminals over the fourth portion of the body, and substantially parallel to the c-plane.

12. The device structure of claim 11, wherein the terminals comprise a source and drain on opposite sides of a gate electrode.

13. The device structure of claim 12, wherein a top surface of the fourth portion of the body is substantially parallel to a c-plane of the Group III-N material and the gate electrode is over a top surface of the fourth portion of the body.

14. The device structure of claim 13, wherein the c-plane is no more than 10° from parallel to a (100) plane of the substrate.

15. The device structure of claim 14, wherein the top surface of the fourth portion of the body has a lower defect density than the second portion of the body.

16. A system, comprising:
a power supply; and
an integrated circuit (IC) coupled to receive power from the power supply, wherein the IC comprises a transistor having the device structure of claim 1.

17. The system of claim 16, wherein the IC is a system-on-chip (SoC) further comprising MOSFETs having a silicon channel.

18. The system of claim 16, wherein the system is to display, process and wirelessly transmit electronic data.

* * * * *